United States Patent
Staple et al.

(10) Patent No.: US 6,701,037 B2
(45) Date of Patent: Mar. 2, 2004

(54) MEMS-BASED NONCONTACTING FREE-SPACE OPTICAL SWITCH

(75) Inventors: Bevan Staple, Longmont, CO (US); Richard Roth, Boulder, CO (US)

(73) Assignee: PTS Corporation, San Jose, CA (US)

( * ) Notice: Subject to any disclaimer, the term of this patent is extended or adjusted under 35 U.S.C. 154(b) by 330 days.

(21) Appl. No.: 09/899,002

(22) Filed: Jul. 3, 2001

(65) Prior Publication Data

US 2003/0012488 A1 Jan. 16, 2003

(51) Int. Cl.[7] .................................................. G02B 6/35
(52) U.S. Cl. ........................................................ 385/18
(58) Field of Search ............................... 385/16–24, 40, 385/47

(56) References Cited

U.S. PATENT DOCUMENTS

| | | | |
|---|---|---|---|
| 5,212,582 A | 5/1993 | Nelson | |
| 5,414,540 A | 5/1995 | Patel et al. | 359/39 |
| 5,600,383 A | 2/1997 | Hornbeck | |
| 5,917,625 A | 6/1999 | Ogusu et al. | 359/130 |
| 5,960,133 A | 9/1999 | Tomlinson | 385/18 |
| 5,969,848 A * | 10/1999 | Lee et al. | 359/298 |
| 5,999,672 A | 12/1999 | Hunter et al. | 385/37 |
| 6,028,689 A | 2/2000 | Michalicek et al. | 359/224 |
| 6,040,935 A | 3/2000 | Michalicek | 359/198 |
| 6,097,519 A | 8/2000 | Ford | 385/130 |
| 6,097,859 A | 8/2000 | Solgaard | 385/17 |
| 6,108,471 A | 8/2000 | Zhang et al. | 385/37 |
| 6,128,122 A | 10/2000 | Drake et al. | 359/224 |
| 6,307,657 B1 | 10/2001 | Ford | |
| 6,480,320 B2 * | 11/2002 | Nasiri | 359/291 |
| 6,597,048 B1 * | 7/2003 | Kan | 257/415 |
| 2001/0044165 A1 * | 11/2001 | Lee et al. | 438/52 |
| 2002/0135850 A1 * | 9/2002 | Hagelin et al. | 359/224 |

OTHER PUBLICATIONS

Andrew et al., "Electrostatic Model for an Asymmetric Combdrive", Journal of Microelectromechanical Systems, vol. 9, No. 1, Mar. 2000, pp. 126–135.*

Rallison, R.D,, "Dense Wavelength Division Multiplexing (DWDM) and the Dickson Grating," White Paper, Jan. 6, 2001.

U.S. patent application Ser. No. 09/442,061, Weverka et al., filed Nov. 16, 1999.

T. Akiyama, et al.; "Controlled Stepwise Motion in Polysilicon Microstructures," Journal of Microelectromechanical Systems, vol. 2, No. 3, Sep. 1993; pp. 106–110.

C.M.A. Ashruf, et al., "Galvanic porous silicon formation without external contacts," Sensors and Actuators 74 (1999) pp. 118–122.

Kenneth Bean, et al., "Anisotropic Etching of Silicon," IEEE Transactions on Electron Devices, vol. Ed–25, No. 10, Oct. 1978.

Dino R. Ciarlo, "A latching Accelerometer fabricated by the anisotropic etching of (110) oriented silicon wafers," Lawrence Livermore Nat'l Laboratory, Mar. 1, 1992.

(List continued on next page.)

Primary Examiner—Akm Enayet Ullah
Assistant Examiner—Michelle R. Connelly-Cushwa
(74) Attorney, Agent, or Firm—Townsend and Townsend and Crew LLP

(57) ABSTRACT

A microstructure for steering light that mitigates stiction problems is provided. A first tiltable assembly that includes a reflective coating is connected with a substrate. A second tiltable assembly is also connected with the substrate. First and second electrodes are connected with the substrate and are configured to tilt the two tiltable assemblies such that they are interdigitated. In various embodiments, the tiltable assemblies are configured as cantilever arrangements and/or torsion-beam arrangements.

29 Claims, 14 Drawing Sheets

OTHER PUBLICATIONS

A.S. Dewa, et al., "Development of a Silicon Two–Axis Micromirror for an Optical CrossConnect," Solid State Sensors and Actuators Workshop, Hilton Head, South Carolina, pp. 93–96.

Joseph Ford et al., "Wavelength Add Drop Switching Using Tilting Micromirrors," Journal of Lightwave Technology, vol. 17, No. 5, May 1999.

J. Grade et al., A Large–Deflection Electrostatic Actuator for Optical Switching Applications, Solid–State Sensor and Actuator Workshop, Hilton Head Island, South Carolina, Jun. 4–8, 2000; pp. 97–100.

V. Kaajakari et al.; "Ultrasonic Actuation for MEMS Dormancy–Related Stiction Reduction," in MEMS Reliability for Critical Applications, Proceedings of SAPIE vol. 4180 (2000); pp. 60–65.

T.L. Koch et al., "Anisotropically etched deep gratings for InP/InGaAsP optical devices," J.App. Phys. 62 (8), Oct. 15, 1987.

I. Nishi et al., "Broad–Passband–Width Optical Filter for Multi–Demultiplexer Using a Diffraction Grating and a Retroreflector Prism," Electronics Letters, vol. 21, No. 10, May, $9^{th}$, 1985.

P. Phillippe et al., "Wavelength demultiplexer: using echelette gratings on silicon substrate," Applied Optics, vol. 24, No. 7, Apr. 1, 1985.

M. Schilling et al., "Deformation–free overgrowth of reactive ion beam etched submicron structures in InP by liquid phase epitaxy," Appl. Phys. Lett. 49 (12), Sep. 22, 1986.

Z. J. Sun et al., Demultiplexer with 120 channels and 0.29–nm Channel Spacing, IEEE Photonics Technology Letters, vol. 10, No. 1, Jan. 1998.

W. Tang, et al., "Electrostatically Balanced Comb Drive for Controlled Levitation," Reprinted from Technical Digest IEEE Solid–State Sensor and Actuator Workshop, Jun. 1990; pp. 198–202.

L. Torcheux et al., "Electrochemical Coupling Effects on the Corrosion of Silicon Samples in HF Solutions," J. Electrochem.Soc., vol. 142, No. 6, Jun. 1995.

P. VanKessel et al., "A MEMS–Based Projection Display," Proceedings of the IEEE, vol. 86, No. 8, Aug. 1998; pp. 1687–1704.

Microfabricated Silicon High Aspect Ratio Flexures for In–Plane Motion; dissertation by C. Keller, Fall 1998.

Gimballed Electrostatic Microactuators with Embedded Interconnects; dissertation by L. Muller; Spring 2000.

* cited by examiner

MEMS-BASED NONCONTACTING FREE-SPACE OPTICAL SWITCH

CROSS-REFERENCES TO RELATED APPLICATIONS

This application is being filed concurrently with related U.S. Patent Applications: "BISTABLE MICROMIRROR WITH CONTACTLESS STOPS" by Lilac Muller; "METHODS AND APPARATUS FOR PROVIDING A MULTI-STOP MICROMIRROR," by David Paul Anderson; and "SYSTEMS AND METHODS FOR OVERCOMING STICTION USING A LEVER," by Bevan Staple, David Paul Anderson, and Lilac Muller; all of which are herein incorporated by reference in its entirety for all purposes.

BACKGROUND OF THE INVENTION

This application relates generally to microelectromechanical systems, and more particularly to MEMS devices and methods configured to avoid stiction.

In recent years, increasing emphasis has been made on the development of techniques for producing microscopic systems that may be tailored to have specifically desired electrical and/or mechanical properties. Such systems are generically described as microelectromechanical systems (MEMS) and are desirable because they may be constructed with considerable versatility despite their very small size. In a variety of applications, MEMS component structures may be fabricated to move in such a fashion that there is a risk of stiction between that component structure and some other aspect of the system. One such example of a MEMS component structure is a micromirror, which is generally configured to reflect light from at least two positions. Such micromirrors find numerous applications, including as parts of optical switches, display devices, and signal modulators, among others.

In many applications, such as may be used in fiber-optics applications, such MEMS-based devices may include hundreds or even thousands of micromirrors arranged as an array. Within such an array, each of the micromirrors should be accurately aligned with both a target and a source. Such alignment is generally complex and typically involves fixing the location of the MEMS device relative to a number of sources and targets. If any of the micromirrors is not positioned correctly in the alignment process and/or the MEMS device is moved from the aligned position, the MEMS device will not function properly.

In part to reduce the complexity of alignment, some MEMS devices provide for individual movement of each of the micromirrors. An example is provided in FIGS. 1A–1C illustrating a particular MEMS micromirror structure that may take three positions. Each micromirror includes a reflective surface 116 mounted on a micromirror structural film 112 that is connected by a structural linkage 108 to an underlying substrate 104. Movement of an individual micromirror is controlled by energizing actuators 124a and/or 124b disposed underneath the micromirror on opposite sides of the structural linkage 108. Hard stops 120a and 120b are provided to stop the action of the micromirror structural film 112. Energizing the actuator 124a on the left side of the structural linkage 108 causes the micromirror to tilt on the structural linkage 108 towards that side until one edge of the micromirror structural film 112 contacts the left hard stop 120a, as shown in FIG. 1A. Alternatively, the actuator 124b on the right side of the structural linkage 108 may be energized to cause the micromirror to tilt in the opposite direction, as shown in FIG. 1B. When both actuators are de-energized, as shown in FIG. 1C, the micromirror returns to a static position horizontal to the structural linkage 108. In this way, the micromirror may be moved to any of three positions. This ability to move the micromirror provides a degree of flexibility useful in aligning the MEMS device, although the alignment complexity remains significant. Sometimes hard stops 120a and 120b are not provided so that the micromirror structural film 112 is in direct contact with the substrate 104.

In certain applications, once the micromirror is moved to the proper position, it may remain in that position for ten years or more. Thus, for example, one side of an individual micromirror structural film may remain in contact with the hard stop or substrate for extended periods. Maintaining such contact increases the incidence of dormancy-related stiction. Such stiction results in the micromirror remaining in a tilted position even after the actuators are de-energized. Some theorize that stiction is a result of molecule and/or charge build up at the junction between the micromirror structural film and the hard stop or substrate. For example, it has been demonstrated that an accumulation of $H_2O$ molecules at the junction produces capillary forces that increase the incidence of stiction.

Thus, one solution to overcome stiction is to package the MEMS device in a hermetic or inert environment. Such an environment reduces the possibility of molecule accumulation at the junction. However, such packaging is costly and prone to failure where seals break or are not properly formed. Further, such packaging is incompatible with many types of MEMS devices. In addition, such packaging does not reduce stiction related to charge build up at the junction.

In "Ultrasonic Actuation for MEMS Dormancy-Related Stiction Reduction", Proceedings of SPIE Vol. 4180 (2000), which is herein incorporated by reference for all purposes, Ville Kaajakari et al. describe a system for overcoming both molecule and charge related stiction. The system operates by periodically vibrating an entire MEMS device to overcome stiction forces. While there is evidence that vibrating the entire MEMS device can overcome stiction at discrete locations within the device, such vibration causes temporary or even permanent misalignment of the device. Thus, freeing an individual micromirror often requires performance of a costly alignment procedure. Even where the device is not permanently misaligned by the vibration, it is temporarily dysfunctional while the vibration is occurring.

Thus, there exists a need in the art for systems and methods for overcoming stiction in MEMS devices without causing misalignment.

SUMMARY OF THE INVENTION

Embodiments of the invention are directed to a microstructure for steering light that mitigates stiction problems. A first tiltable assembly that includes a reflective coating is connected with a substrate. A second tiltable assembly is also connected with the substrate. First and second electrodes are connected with the substrate and are configured to tilt the two tiltable assemblies such that they are interdigitated. In various embodiments, the tiltable assemblies are configured as cantilever arrangements and/or torsion-beam arrangements.

The first tiltable assembly may include a first structural linkage connected with the substrate. A first structural film is supported by the first structural linkage and has a plurality of fingers at an end of the first structural film. The reflective coating is included on the first structural film. The second tiltable assembly may similarly include a second structural linkage connected with the substrate. A second structural film is supported by the second structural linkage and has a plurality of fingers at an end of the second structural film. The fingers at the ends of the first and second structural films may be used to interdigitate the tiltable assemblies. In one embodiment, the first structural linkage has a greater height above the substrate than the second structural linkage.

Embodiments of the invention are also directed to a method for fabricating such a microstructure. A first tiltable assembly that includes a reflective coating is formed on a substrate. A second tiltable assembly is also formed on the substrate. First and second electrodes are formed on the substrate and are configured to tilt the tiltable assemblies upon activation such that the tiltable assemblies interdigitate.

In still other embodiments, a method is provided for operating an optical switch. A first assembly is tilted by applying a first electrostatic force. The first assembly may include a first pivot connected with a substrate, a first structural film supported by the first structural linkage, and a reflective coating. The first structural film may have a plurality of fingers at an end of the first structural film. A second assembly is also tilted by applying a second electrostatic force. The second assembly may include a second pivot connected with the substrate and a second structural film supported by the second structural linkage. The second structural film also includes a plurality of fingers at an end of the second structural film. The first and second assemblies are held electrostatically in a fixed position with the fingers of the first and second structural films interdigitated.

In still other embodiments, a wavelength router that incorporates a microstructure for steering light is provided. The wavelength router is configured for receiving light having a plurality of spectral bands at an input port and for directing subsets of the spectral bands to a plurality of output ports. A free-space optical train is disposed between the input port and the output ports providing optical paths for routing the spectral bands. The optical train also includes a dispersive element disposed to intercept light traveling from the input port. A routing mechanism is provided having at least one dynamically configurable routing element to direct a given spectral band to different output ports. The dynamically configurable routing element includes a tiltable micromirror assembly having a micromirror structural film with a plurality of fingers at one of its ends. It also includes a tiltable snare assembly having a snare structural film with a plurality of fingers at one of its ends. A plurality of electrodes is configured to tilt the micromirror assembly and snare assembly upon activation such that the fingers of the micromirror structural film and snare structural film interdigitate.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and is enclosed in parentheses to denote one of multiple similar components. When reference is made to a reference numeral without specification to an existing sublabel, it is intended to refer to all such multiple similar components.

DESCRIPTION OF THE SPECIFIC EMBODIMENTS

1. Introduction

Figure 1A:
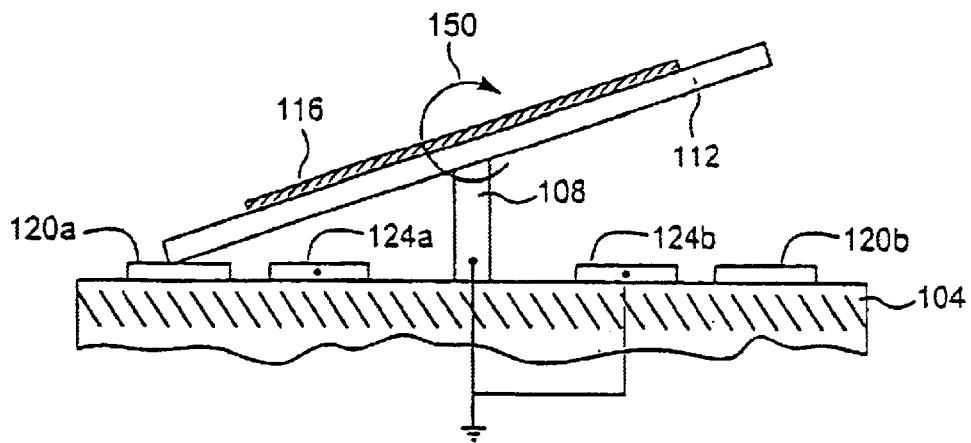
FIGS. 1A, 1B, and 1C are cross-sectional drawings of a tilting micromirror in three positions effected by actuation of different actuators.
Figure 1B:
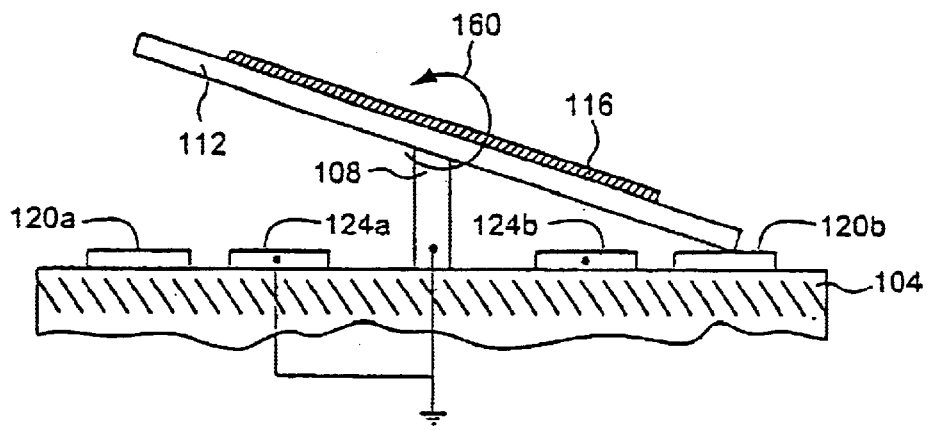
Figure 1C:
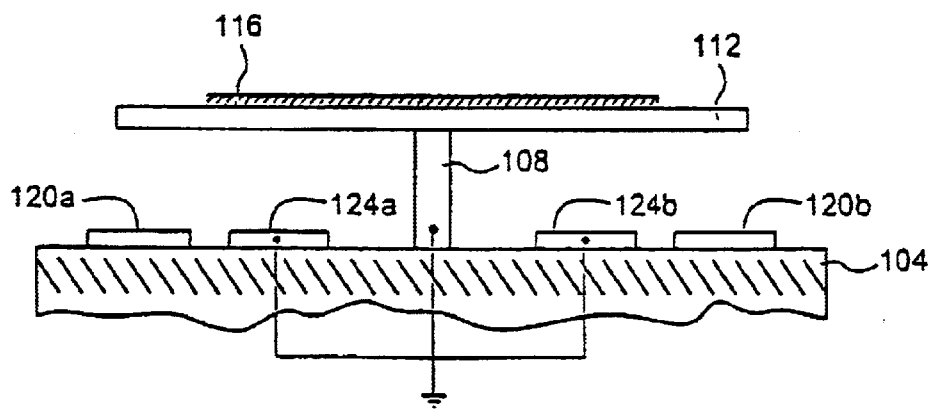
Figure 2:
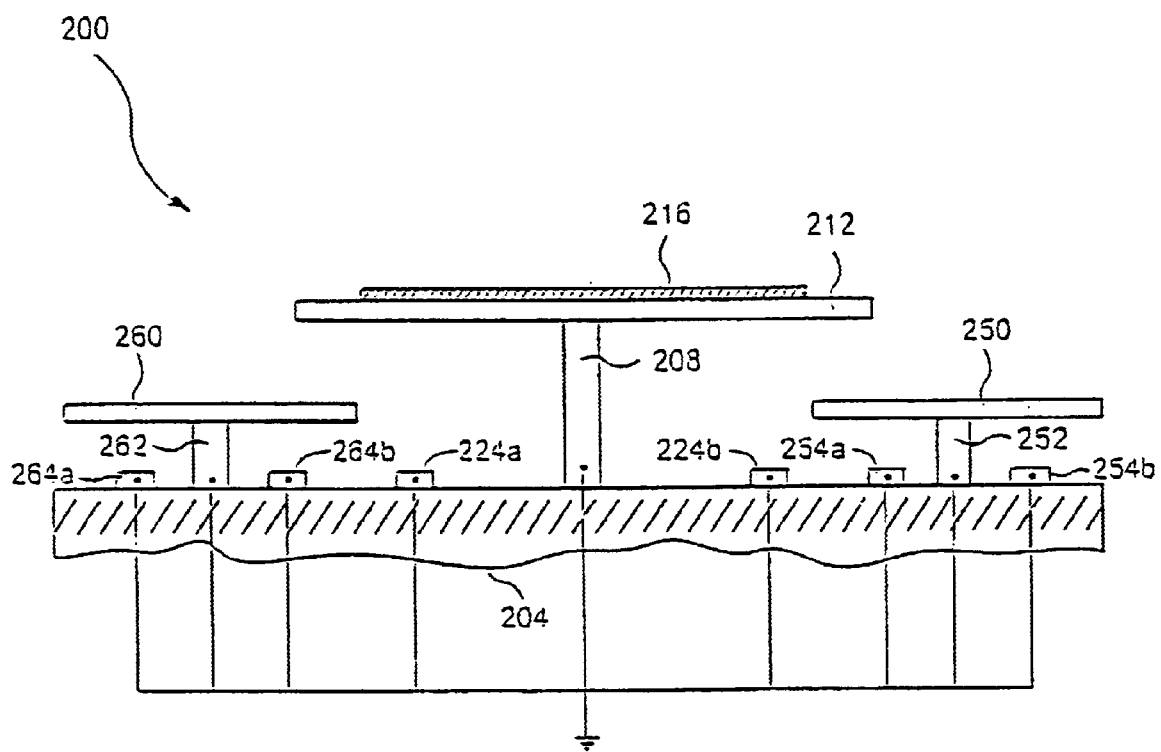
FIGS. 2A, 2B, 2C, 2D, and 2E are cross-sectional drawings of a torsion-beam micromirror configuration in accordance with the invention.
Figure 3A:
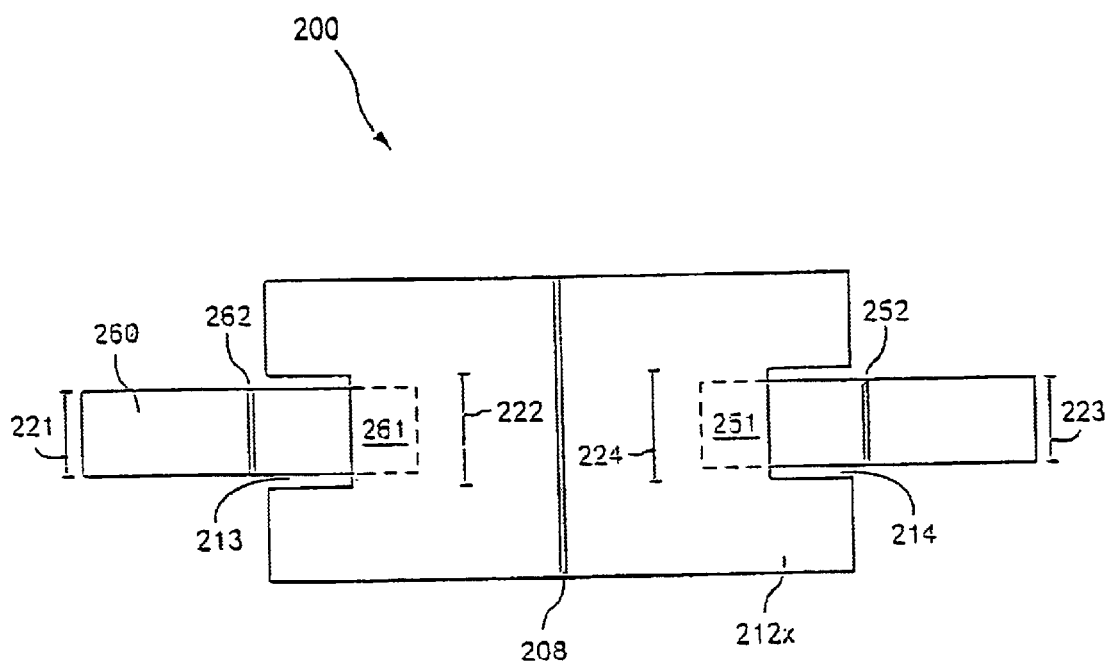
FIG. 3 is a schematic drawing defining a geometry of an electromechanical system defined by the torsion-beam micromirror assembly.
Figure 3B:
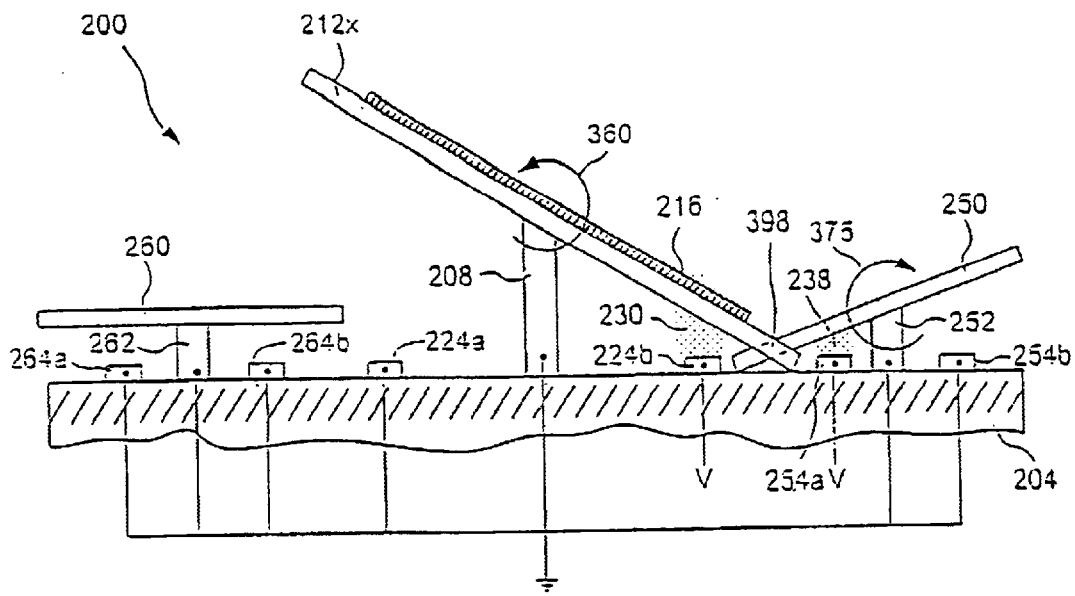
Figure 3C:
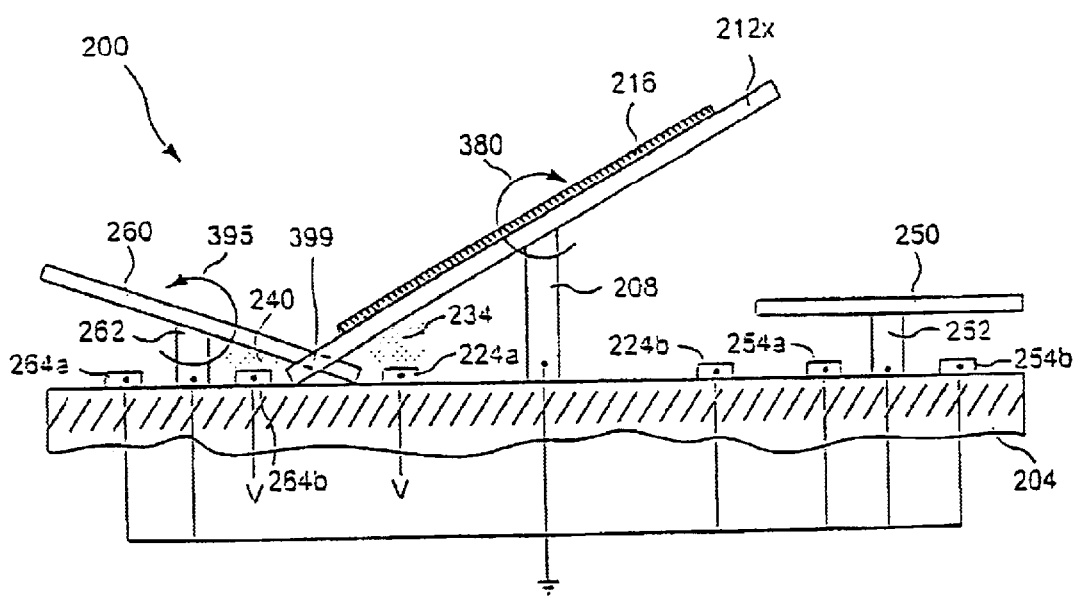
Figure 3D:
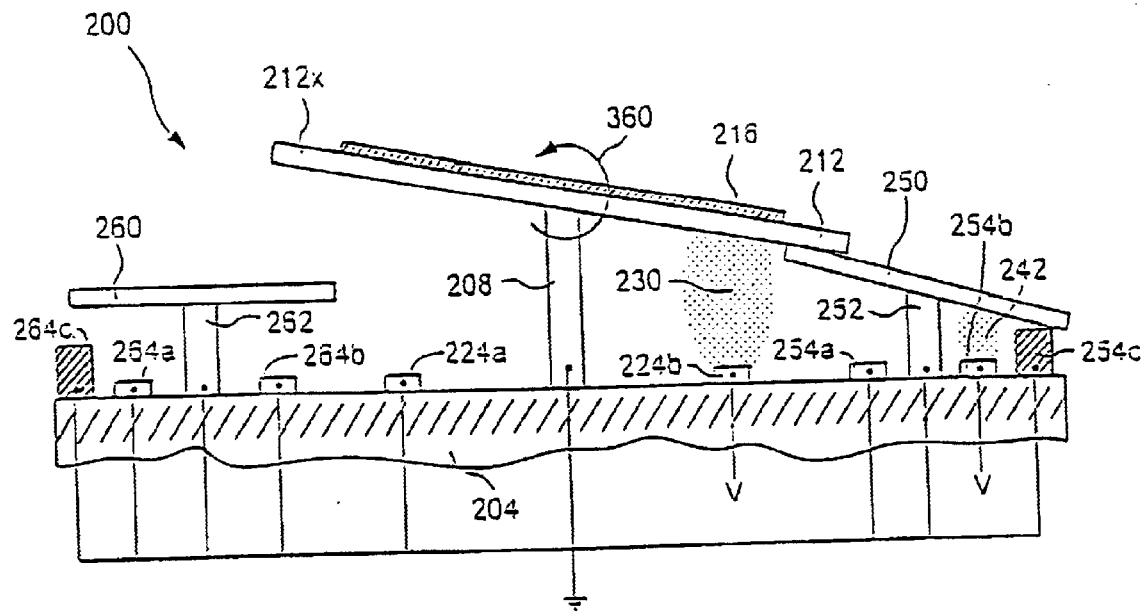
Figure 3E:
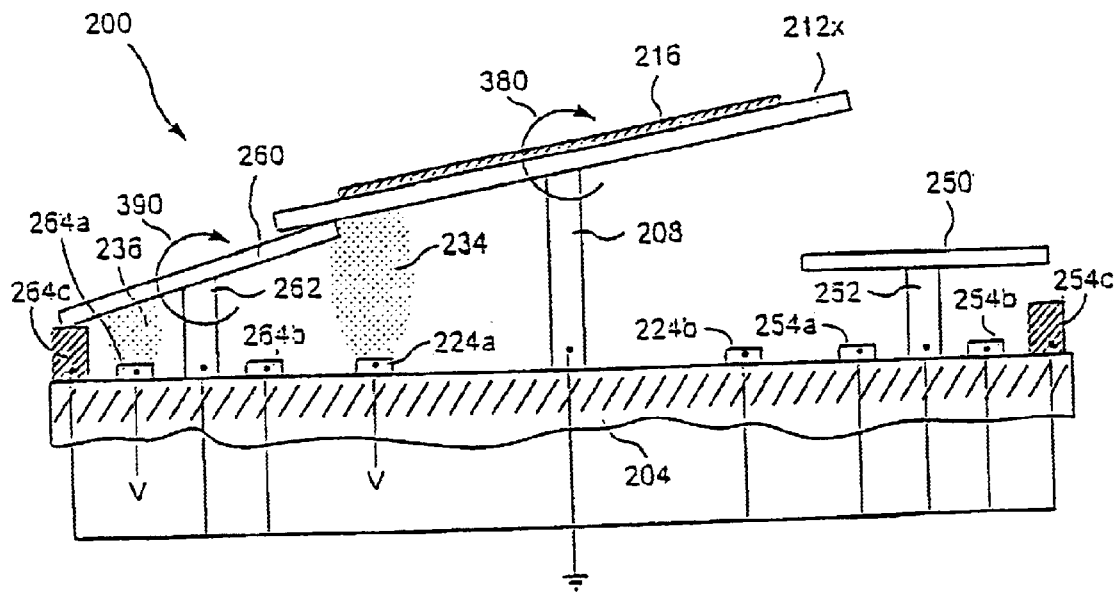
Figure 4A:
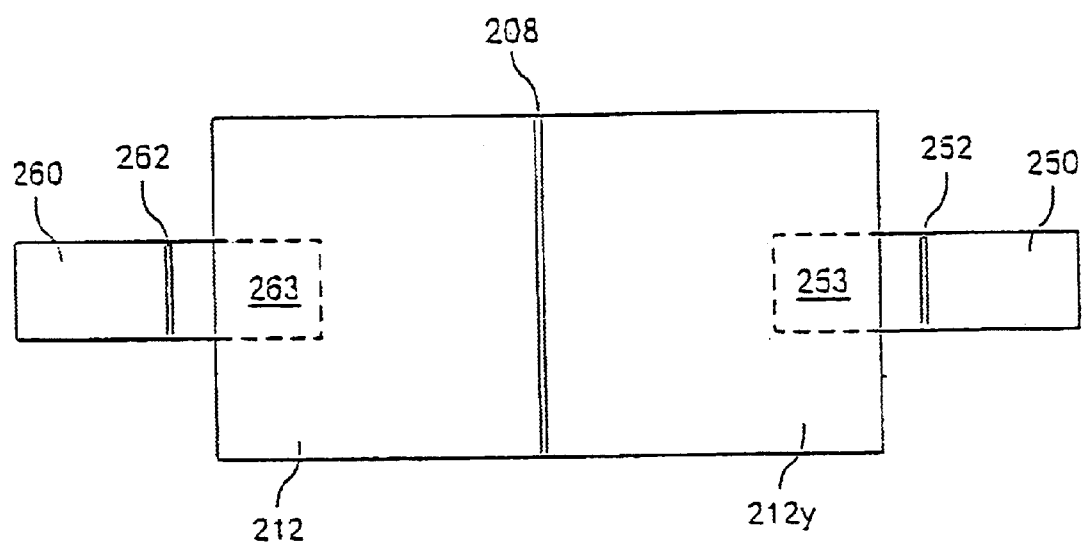
FIG. 4 is a graph illustrating the behavior of capacitive energy stored in one micromirror configuration in accordance with the invention.
Figure 4B:
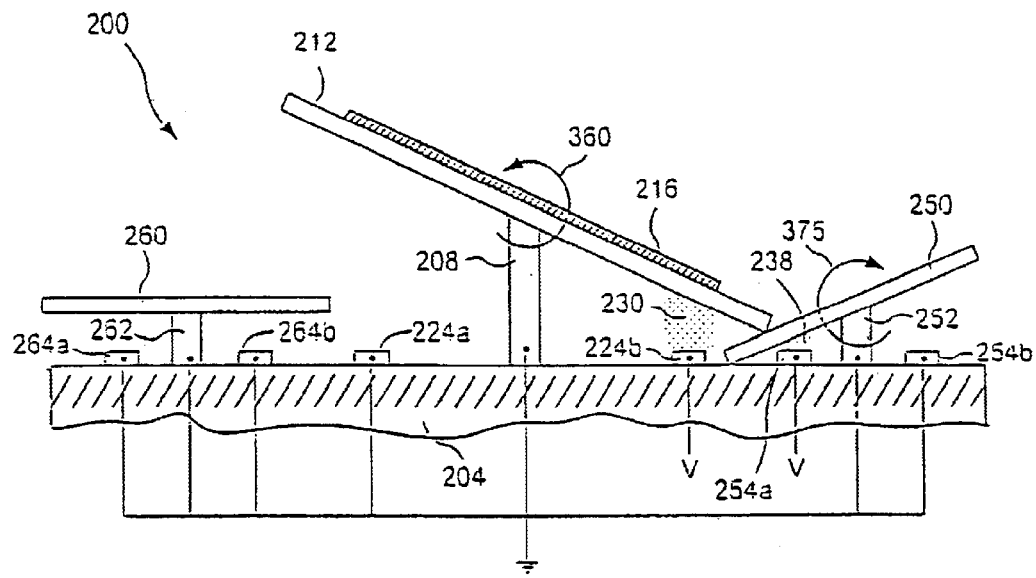
Figure 4C:
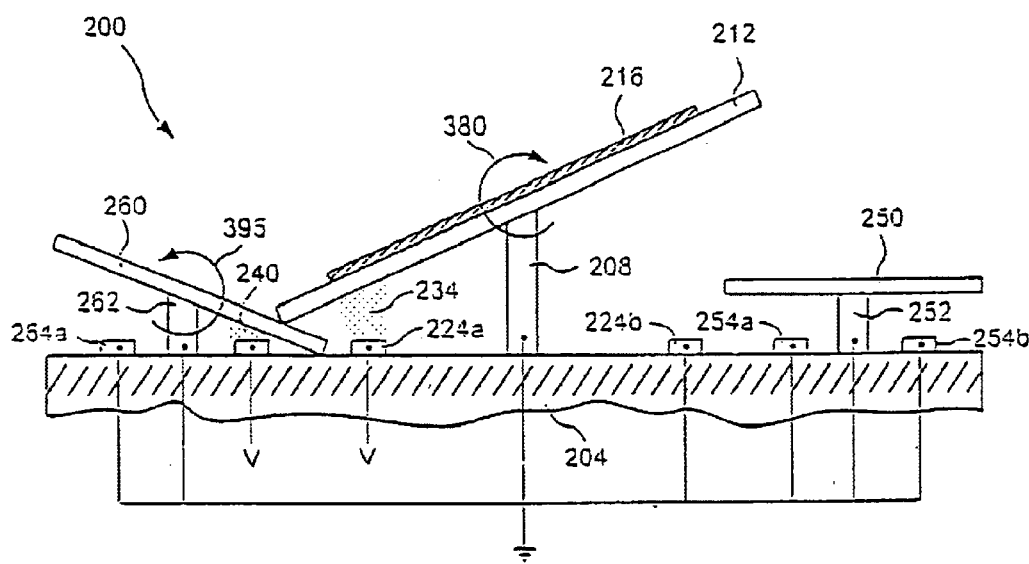

Embodiments of the invention are directed to MEMS methods and devices in which a microstructure is held in one of at least two possible stable positions without contacting either a substrate or hard stop. In certain embodiments, the microstructure is a micromirror that may be rotated to at least two such positions. Because of the ready applicability of such a rotating micromirror to optical-switch applications, some of the embodiments are directed to a wavelength router that uses optical switching. The stability of the microstructure positions is achieved without contact by employing electrostatic fields to hold the microstructure. Since there is no direct contact with the microstructure, stiction is thereby avoided. As will be clear to those of skill in the art from the following description, the invention may be adapted to different types of micromirror configurations, including cantilever micromirrors and torsion-beam micromirrors.

It is noted that throughout herein micromirror configurations are shown schematically in the figures for illustrative purposes. As will be understood by those of skill in the art, the point of rotation of the micromirror structural film should be selected so that in the desired static micromirror configurations both the forces on the structural film and the torques about the point of rotation cancel.

2. Torsion-Beam Micromirror

One embodiment of the invention as applied to a torsion-beam micromirror configuration is illustrated in FIGS. 2A–2E. Each micromirror includes a reflective surface 216 mounted on a micromirror structural film 212 that is connected by at least one structural linkage 208 to an underlying substrate 204. In some embodiments, multiple structural linkages 208 are provided in the plane orthogonal to the page, the axis of rotation of the micromirror structural film 212 being defined by the alignment of the structural linkages. In one such embodiment, two structural linkages 208 are provided approximately on opposite sides of the micromirror along the axis of rotation. Two snap-in electrodes 224a and 224b and two hold electrodes 220a and 220b are provided on the substrate 204, with one of each type of electrode provided on either side of the structural linkage 208. The electrodes 220 and 224 and structural film 212 may be fabricated using standard MEMS techniques. Such MEMS techniques typically involve a combination of depositing structural material, such as polycrystalline silicon, depositing sacrificial material, such as silicon oxide, and dissolving the sacrificial material during a release step, for example with hydrofluoric acid (HF). It is thus sometimes convenient to identify the different structural layers in a MEMS microstructure as "poly-N" layers, where N denotes that a particular such layer was the Nth polysilicon layer deposited in a process that included multiple depositions. Often the first such layer is described as the "poly-0" layer.

The hold electrodes 220a and 220b are connected with the substrate 204 at a position laterally beyond an orthogonal projection of the structural film 212 onto the substrate 204. With such a configuration, the hold electrodes 220a and 220b are outside the region underneath the micromirror structural film 212. This geometry ensures that when the micromirror is in the hold positions shown in FIGS. 2C and 2E, the micromirror structural film 212 is not in contact with the substrate 204. In certain embodiments, the hold electrodes 220a and 220b have a greater height above the substrate 204 than the snap-in electrodes 224a and 224b. The electrodes may thus be fabricated with MEMS techniques in which a poly-0 layer is deposited to form the structure of the snap-in electrodes 224a and 224b and the lower part of the structure of the hold electrodes 222a and 222b. The remainder of the structure of the hold electrodes 221a and 221b may be fabricated with a subsequently deposited poly-1 layer. The micromirror structural film 212 is formed with a poly 3 layer. The reflective surface 216 is formed by depositing a layer of reflective metal, such as gold.

Figure 2A:
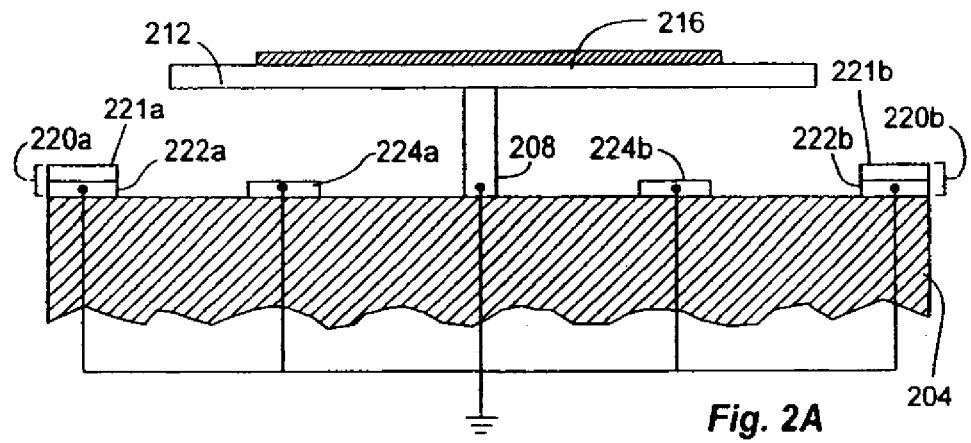

FIG. 2A shows the static horizontal configuration of the micromirror when all four of the electrodes 220a, 220b, 224a, and 224b are commonly grounded with the structural linkage 208. According to embodiments of the invention, the micromirror may be deflected to a position tilted to the right, as shown in FIG. 2C, or to a position tilted to the left, as shown in FIG. 2E. Either of these tilted positions is maintained through activation of the right or left hold electrode 220 as appropriate, such that the micromirror and structural film 212 have no contact with the substrate 204 or with a hard stop.

Figure 2B:
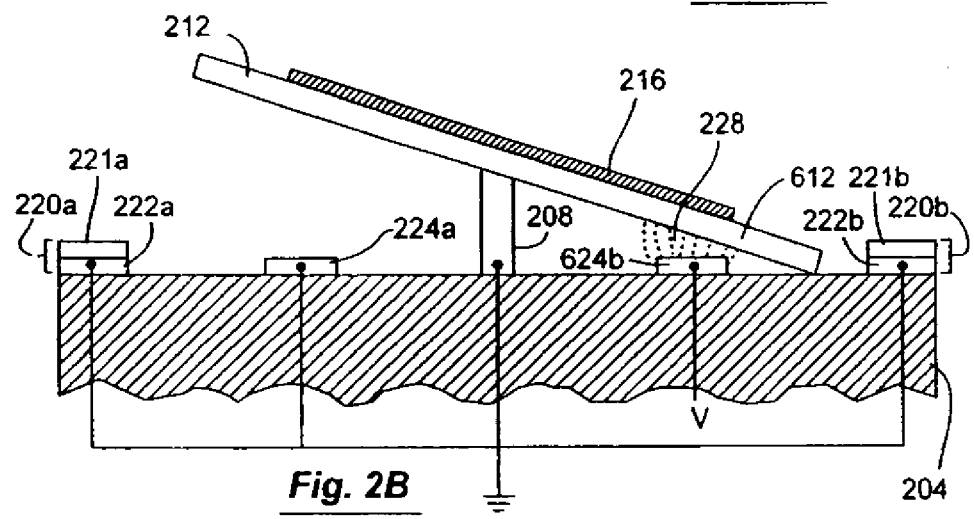
Figure 2C:
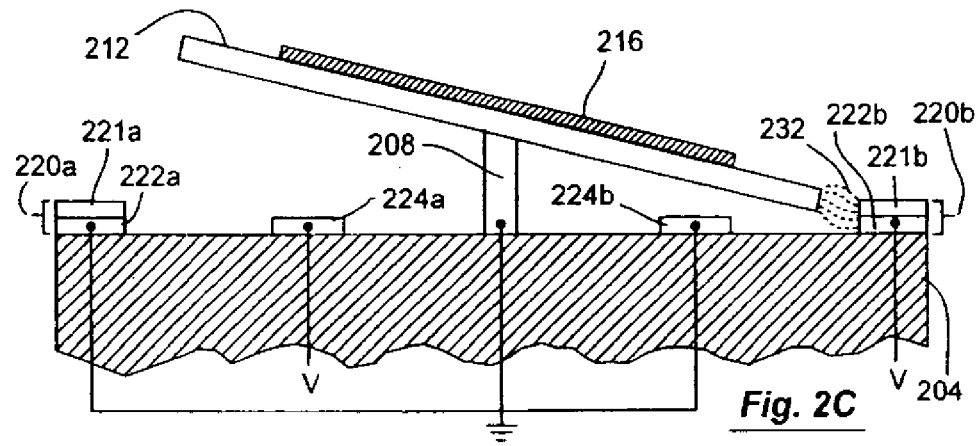

In order to achieve the right-tilted position, for example, the right snap-in electrode 224b is activated, as shown in FIG. 2B, by applying a voltage V to that electrode with respect to the common ground. The potential difference between the structural film 212 and the right snap-in electrode 224b thus creates an electric field with dotted field lines 228 shown. That right side of the structural film is thus deflected downwards such that the structural film 216 may come into contact with the substrate 204. Subsequently, the right hold electrode 220b is activated and the right snap-in electrode 224b is deactivated, creating an electric field between the structural film 212 and the right hold electrode 220b, shown by dotted electric field lines 232. This electric field thus maintains the micromirror in its tilted position without any contact with the substrate 204 or a hard stop, thereby avoiding stiction problems.

The micromirror may similarly be tilted to the left position shown in FIG. 2E. Activation of the left snap-in electrode 224a deflects the structural film 212 to the left, perhaps in contact with the substrate 204, with the electric field shown by dotted electric field lines 236. Subsequent deactivation of the left snap-in electrode 224a and activation of the left hold electrode 220a creates an electric field shown by dotted field lines 238 that acts to hold the micromirror in its left tilted position without contact with the substrate 204 or with a hard stop.

Figure 3:
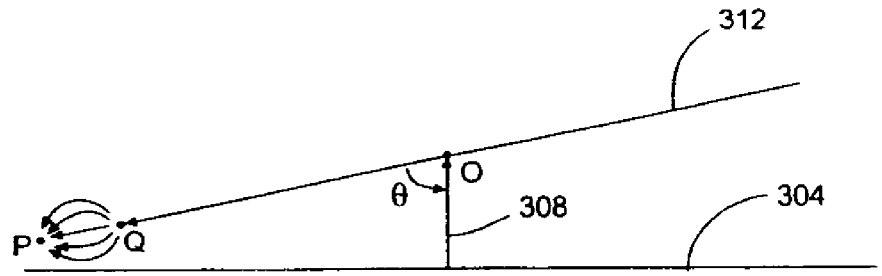
Figure 4:
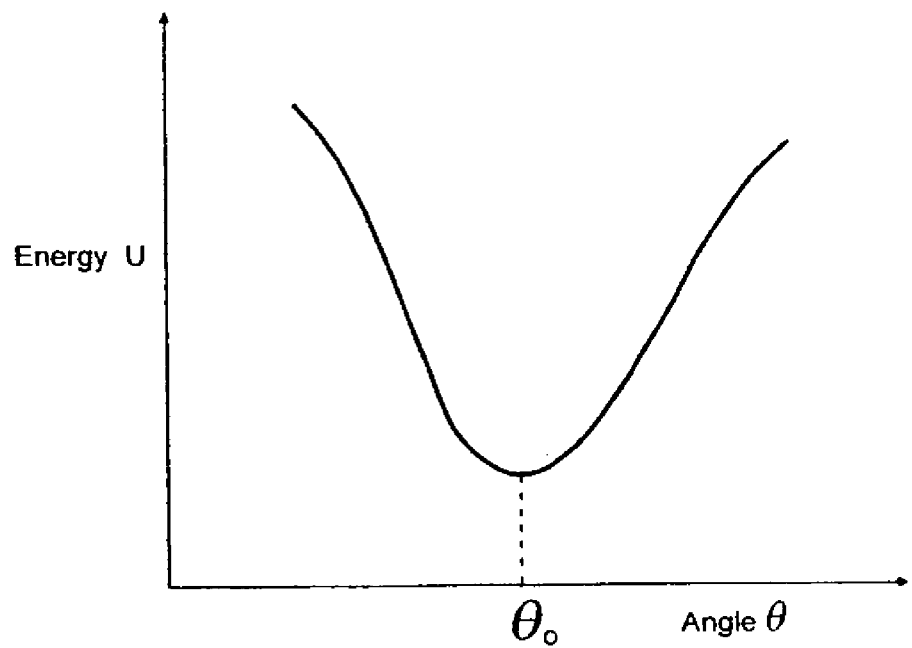
Figure 5A:
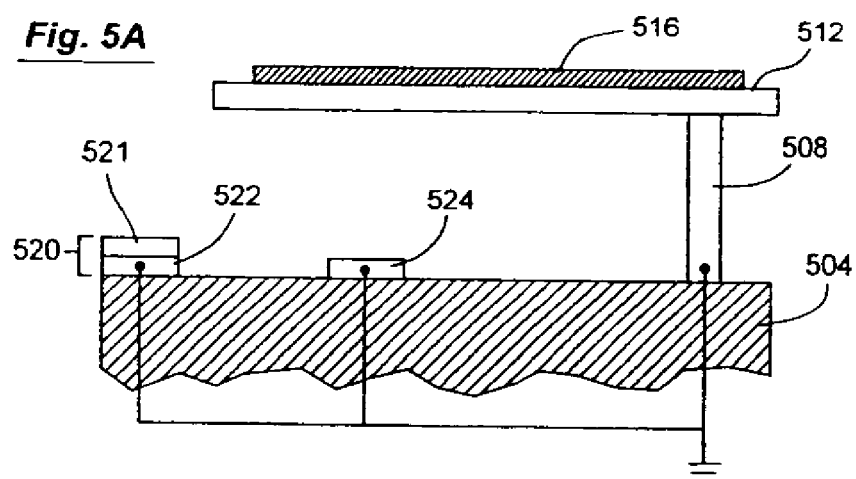
Figure 5B:
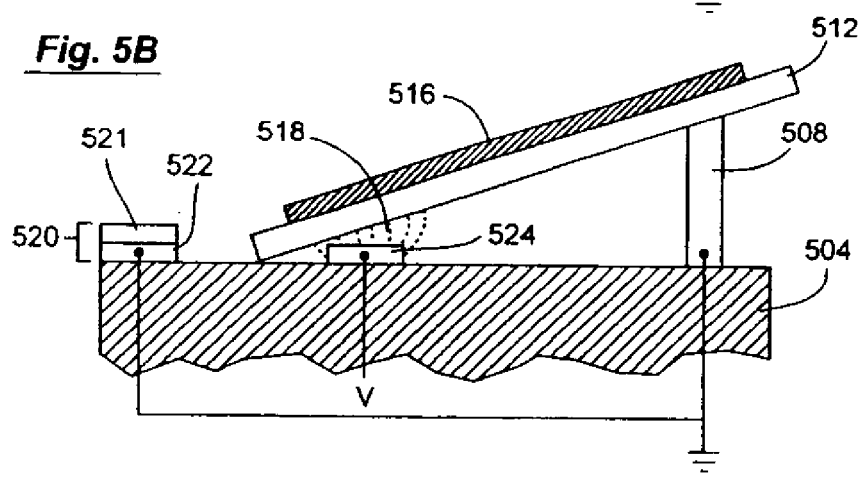
Figure 5C:
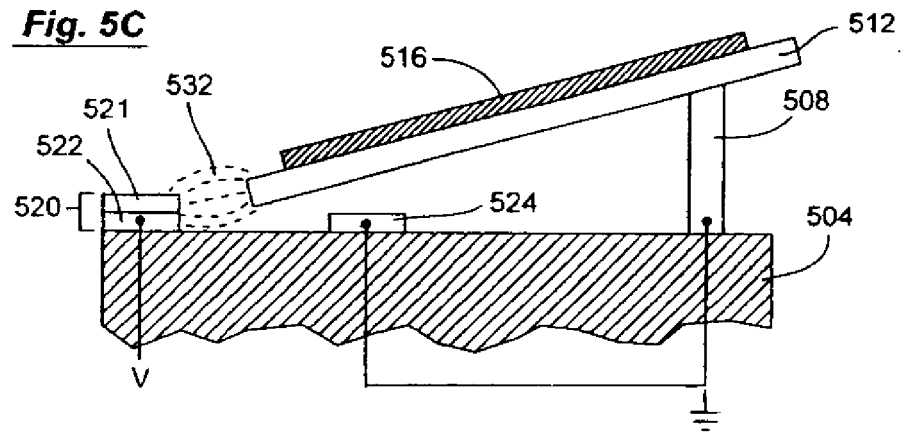

The electromechanical behavior of the system may be better understood with reference to FIGS. 3 and 4. In FIG. 3, the geometry is shown for an arrangement in which a micromirror structural film 312 is held in a left-tilted position on a structural linkage 308 supported by a substrate 304. The structural linkage point O may be defined as an origin for the system with vectors r defining spatial positions, with angle $\theta$ defining the tilt. The electric field E that acts to hold the micromirror structural film 312 in position may be approximately represented with image charges P and Q. The potential difference created by activation of the hold electrode creates a capacitive arrangement defined by the micromirror structural film 312, the active electrode, and the gap between them. This capacitive arrangement has a capacitance $$C = \frac{2U}{V^2},$$

where U is the capacitive energy stored and V is the potential difference applied to the electrode. The capacitive energy may be defined in terms of the displacement and electric fields as $$U = \frac{1}{2} \int dr D(r) \cdot E(r).$$

The displacement field D(r) is related to the electric field E(r) according to the permittivity $\epsilon(r)$ of the air in the gap, $$D(r) = \epsilon E(r)$$

Figure 2D:
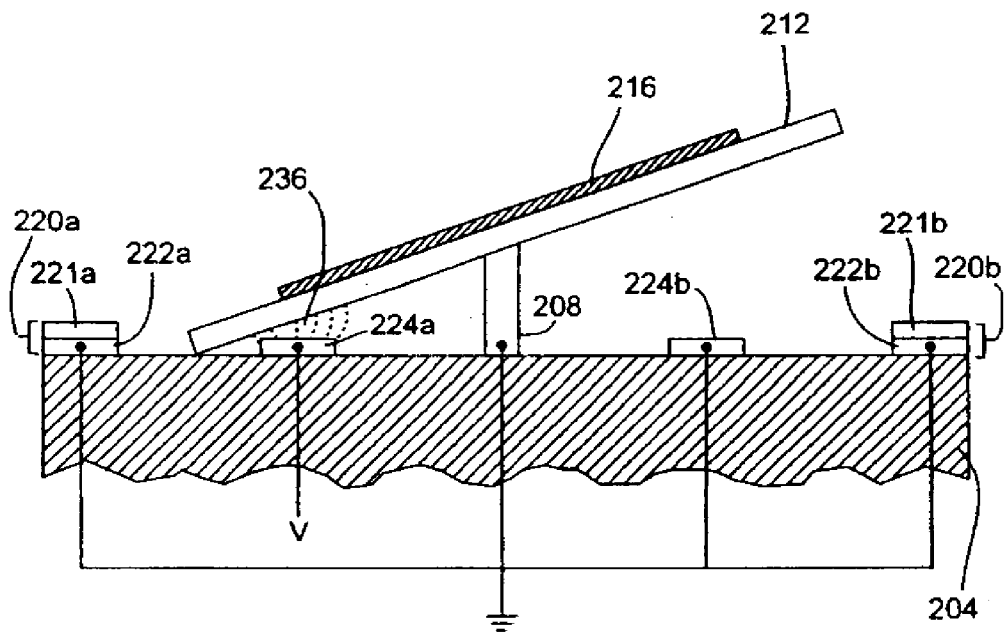
Figure 2E:
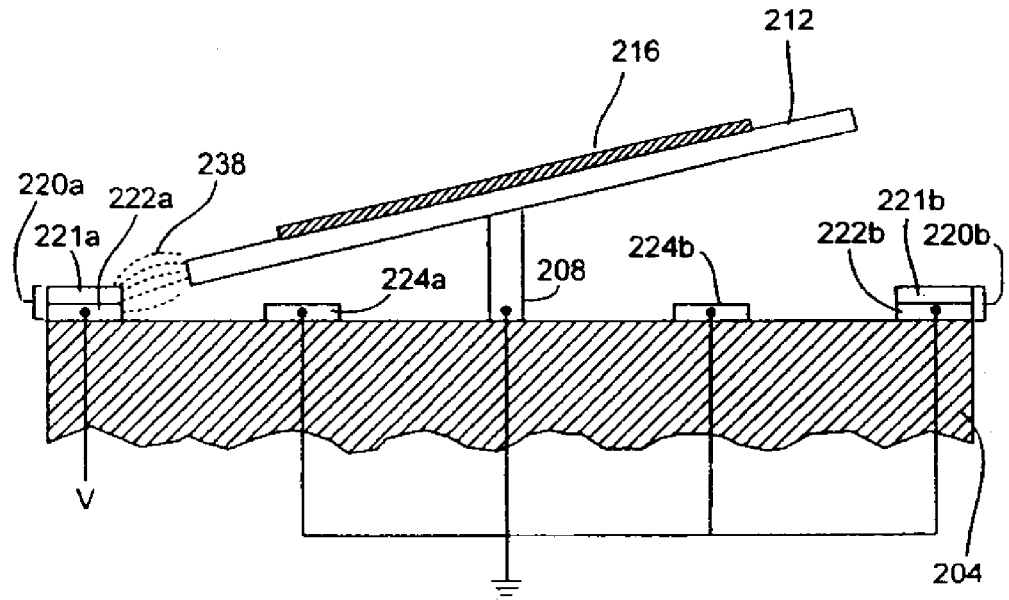

FIG. 4 illustrates the approximate dependence of the capacitive energy U as a function of the tilt angle $\theta$. In orienting the micromirror structural film relative to the active holding electrode, the system will seek to minimize the energy U by selecting angle $\theta_0$. The fact that the system has a preferred tilt angle $\theta_0$ may alternatively be understood from the fact that the attractive electrostatic force is inversely proportional to the square of the separation between the electrode and the micromirror structural film; the system thus seeks to minimize that separation. In some embodiments, it is preferable to activate the hold electrode when the system is already oriented near $\theta_0$. This is achieved in such embodiments, as illustrated in FIGS. 2B and 2D, by using one of the snap-in electrodes to move the micromirror structural film such that $\theta \approx \theta_0$ before activation of the hold electrode.

3. Cantilever Micromirror

Figure 5A:
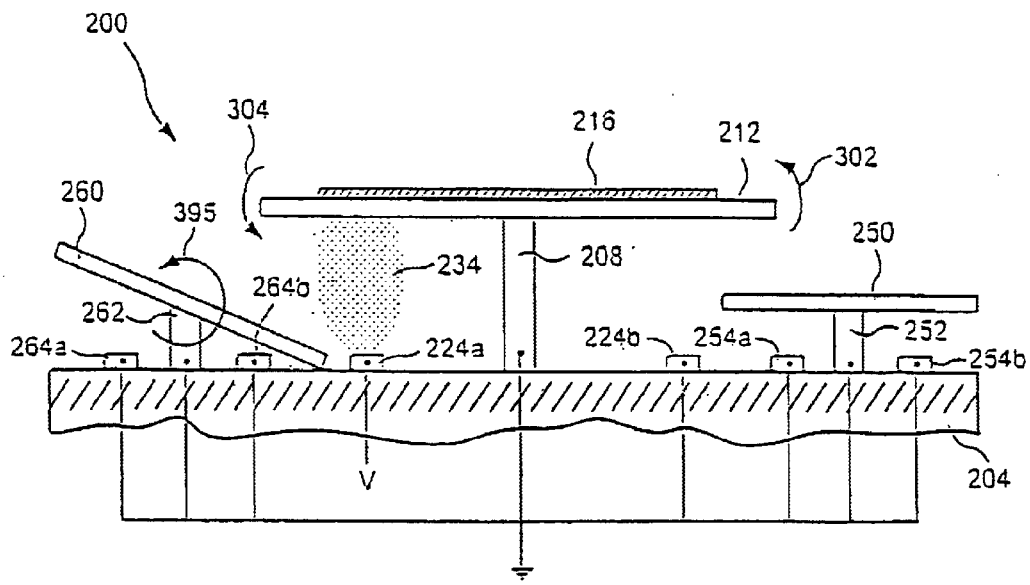
FIGS. 5A, 5B, and 5C are cross-sectional drawings of a cantilever micromirror configuration in accordance with the invention.
Figure 5B:
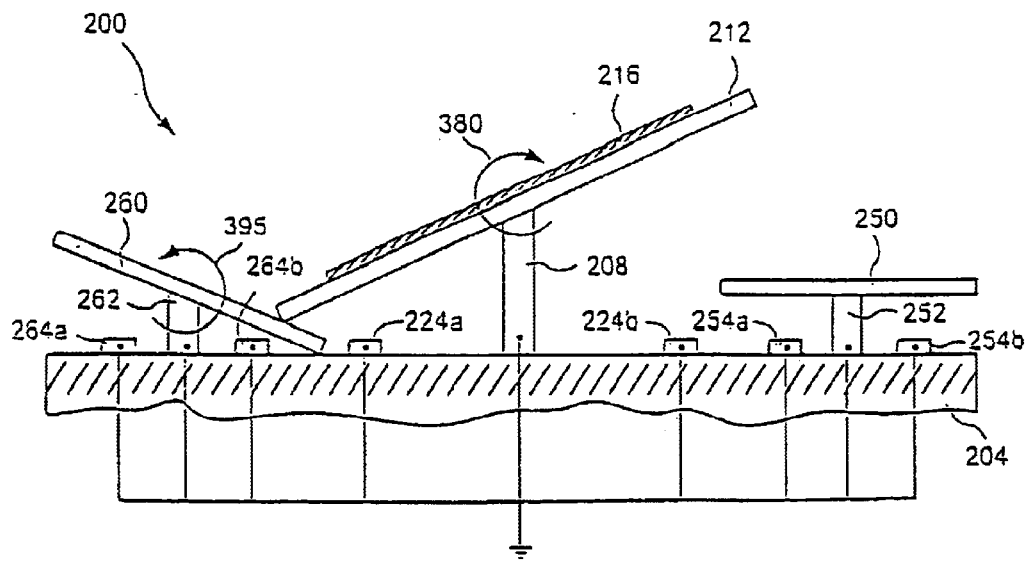
Figure 5C:
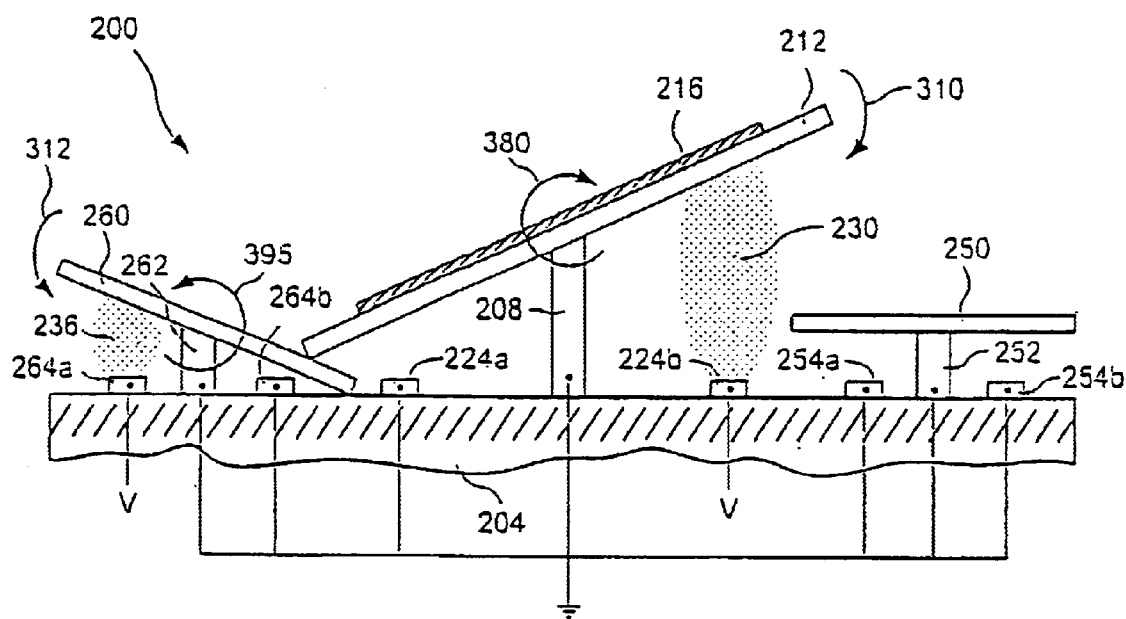

Embodiments of the invention may also be used with cantilever micromirror arrangements. Cantilever arrangements are similar to torsion-beam arrangements, but use a flexure positioned at one side of the micromirror. An example of a cantilever micromirror arrangement in accordance with the invention is illustrated in FIGS. 5A–5C. The cantilever arrangement generally permits a static horizontal position, as shown in FIG. 5A, and a tilted position, as shown in FIG. 5C. Like the torsion-beam arrangement, the tilted position of the cantilever arrangement is maintained without contacting either the substrate 504 or a hard stop.

Each micromirror includes a reflective surface 516 mounted on a micromirror structural film 512 that is connected by at least one flexure 508 to an underlying substrate 504. A snap-in electrode 524 and a hold electrode 520 are provided. The hold electrode 520 may be composed of a poly-0 layer 522 and a poly-1 layer 521. When the snap-in electrode 520 and hold electrode 525 are both commonly grounded with the flexure 508, as shown in FIG. 5A, the micromirror is in the horizontal position. The tilted position may be reached by activating the snap-in electrode 524 to produce the electric field shown with electric field lines 528 in FIG. 5B, and thereby move the micromirror structural film 512 downwards, such that it may come in contact with the substrate. Subsequent deactivation of the snap-in electrode 524 and activation of the hold electrode 520 causes the electric field shown with electric field lines 532 in FIG. 5C to hold the micromirror structural film 512 in its tilted position in a contactless fashion. As for the torsion-beam configuration, the hold electrode 520 is connected with the substrate 504 at a position laterally beyond an orthogonal projection of the structural film 512 onto the substrate 504. With such a configuration, the hold electrode 520 is outside the region underneath the micromirror structural film 512. This geometry ensures that when the micromirror is in the hold position shown in FIG. 5C, the micromirror structural film 512 is not in contact with the substrate 504.

4. Interdigitated Mirror-Snare Configuration

Figure 6A:
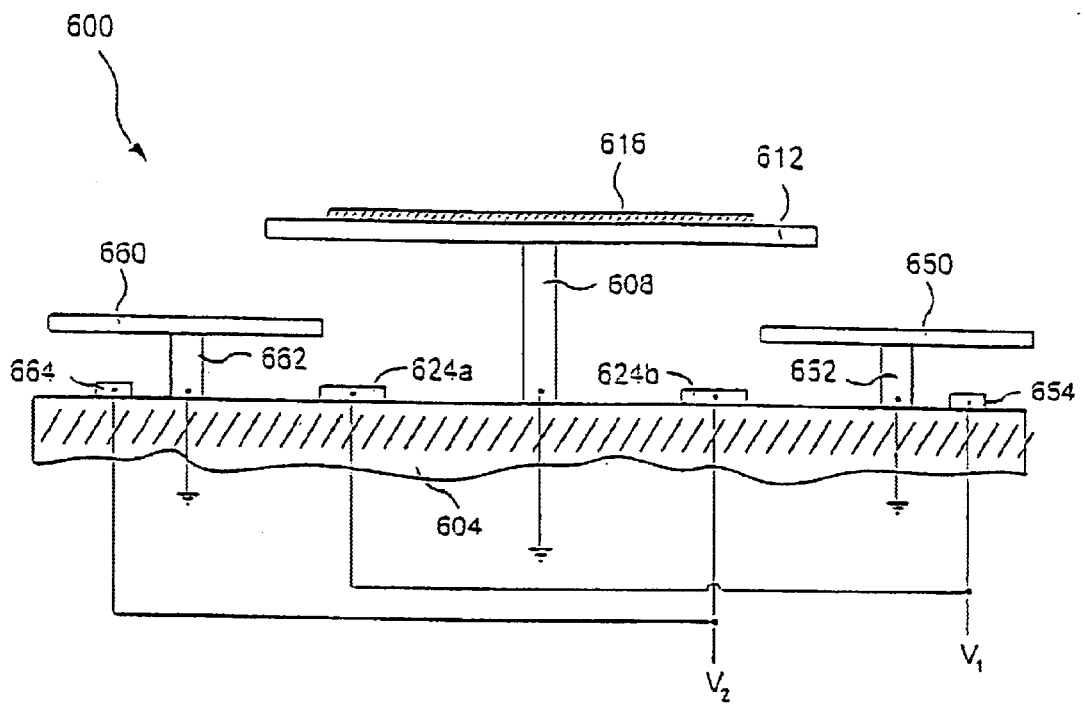
FIGS. 6A and 6B are cross-sectional drawings of an interdigitated snare-micromirror embodiment of the invention.
Figure 6B:
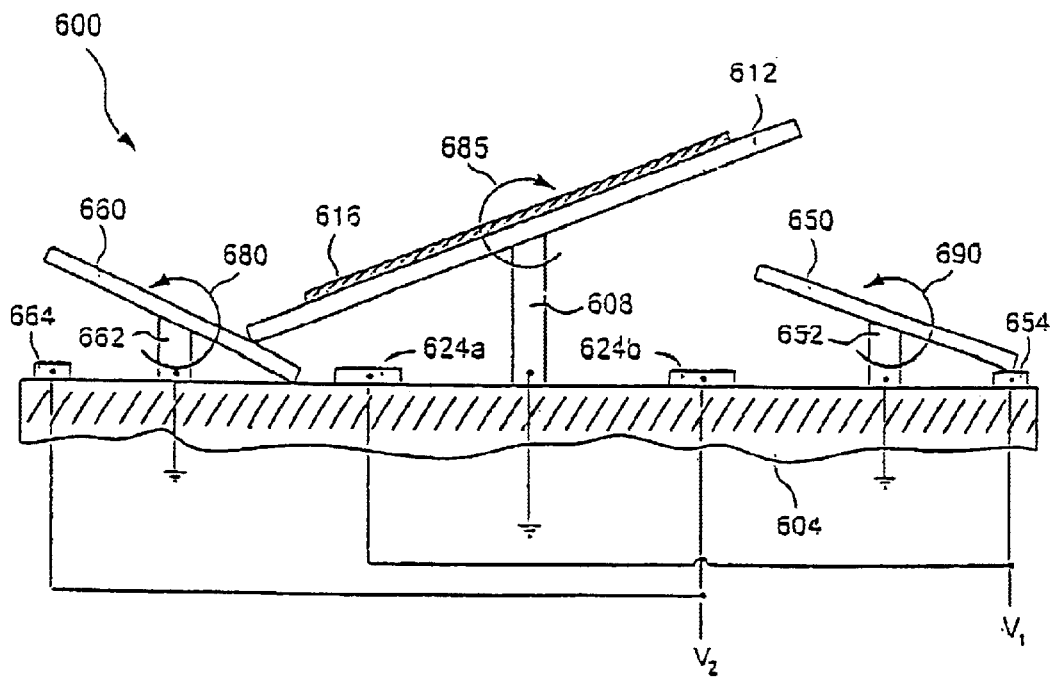
Figure 6C:
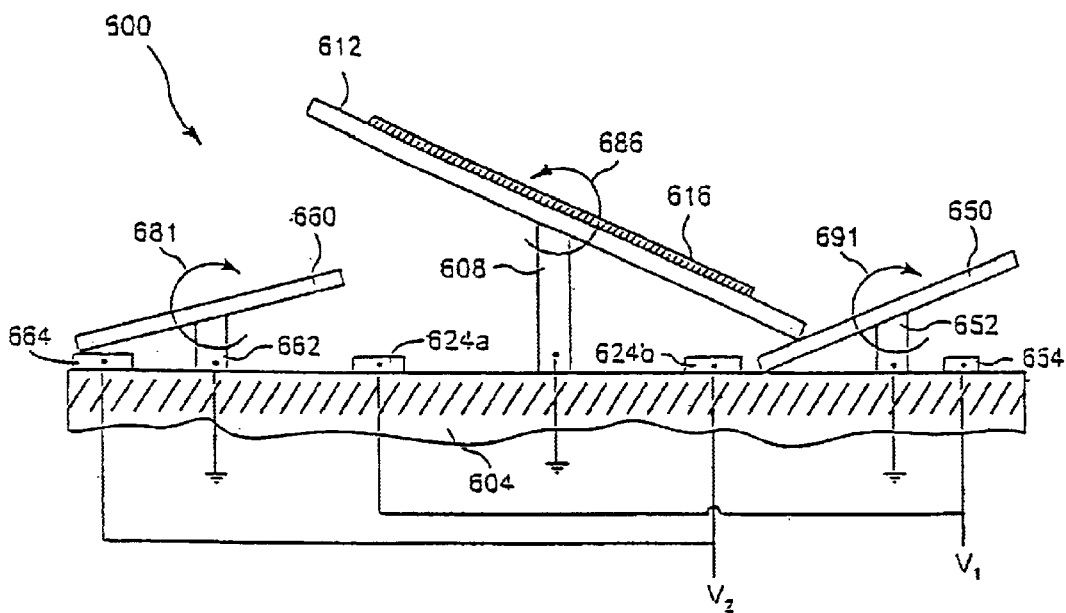
FIG. 6C is a perspective drawing of an interdigitated snare-micromirror embodiment of the invention.

A further embodiment of the invention is illustrated in FIGS. 6A–6C. In this embodiment, the device uses two electrostatically tilted elements, a comb-drive appended micromirror and a comb-drive appended snare. While FIGS. 6A and 6B show a projection drawing of the configuration in each of two positions, FIG. 6C shows a perspective drawing of the micromirror structural film 712 and snare 732 structures and their interdigitation. In particular, the micromirror structural film 712 supports the reflective surface 716 and includes a plurality of micromirror fingers 740. The snare 732 similarly includes a plurality of snare fingers configured for interdigitation with the micromirror fingers 740. The micromirror structural film 712 is supported above a substrate 704 in the cantilever-type fashion described above, with a flexure 708. The snare 732 is similarly supported above the substrate with structural linkage 728. Movement of the micromirror structural film 712 is achieved electrodynamically with micromirror electrode 724 while movement of the snare 732 is achieved electro dynamically with snare electrode 720.

FIG. 6A shows the relative configuration of the micromirror and snare 732 in a static horizontal position. To move the micromirror to its tilted position without contacting other features of the system, both the micromirror electrode 724 and snare electrode 720 are activated. This establishes a potential difference between the micromirror structural film 712 and micromirror electrode 724 that causes the micromirror structural film 712 to tilt downwards towards the side of micromirror electrode 724, shown to the left in FIG. 6B. At the same time, a potential difference is established between the snare 732 and the snare electrode 720, causing the snare to tilt upwards opposite to the side of the snare electrode 720 under bias. Moreover, the established potentials are such that a potential difference exists between the micromirror structural film 712 and the snare 732. Thus, during tilt transitions of the micromirror structural film 712 and snare 732, the micromirror assembly becomes captured in a linear plane by the electrostatic field between the micromirror fingers 740 and snare fingers 744. The micromirror is thereby electrostatically suspended and held in the tilted state without contact.

Figure 6A:
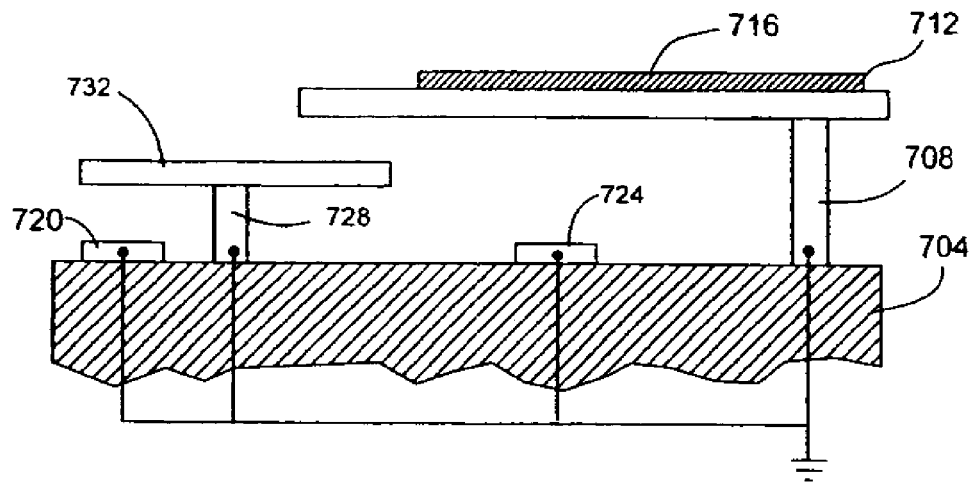
Figure 6B:
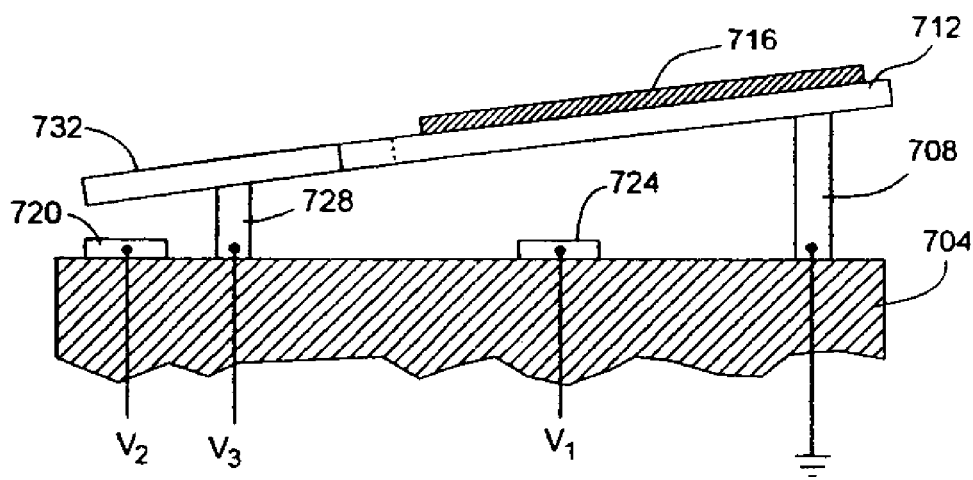
Figure 6C:
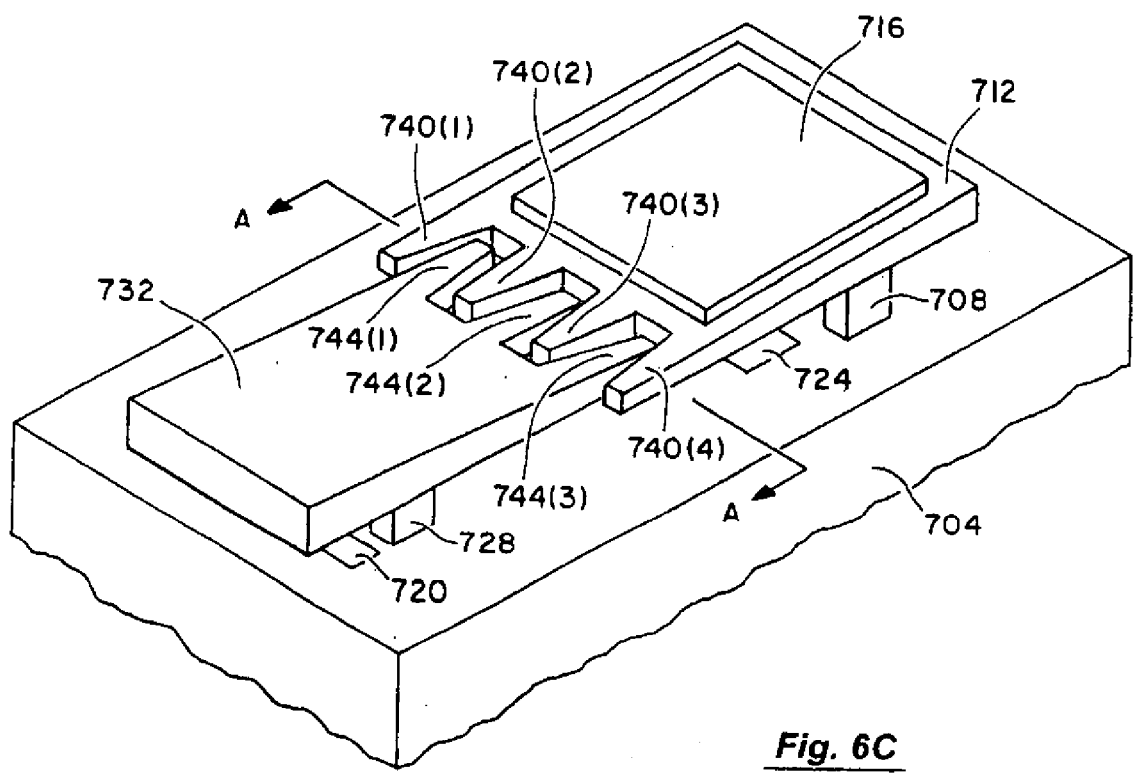
Figure 6D:
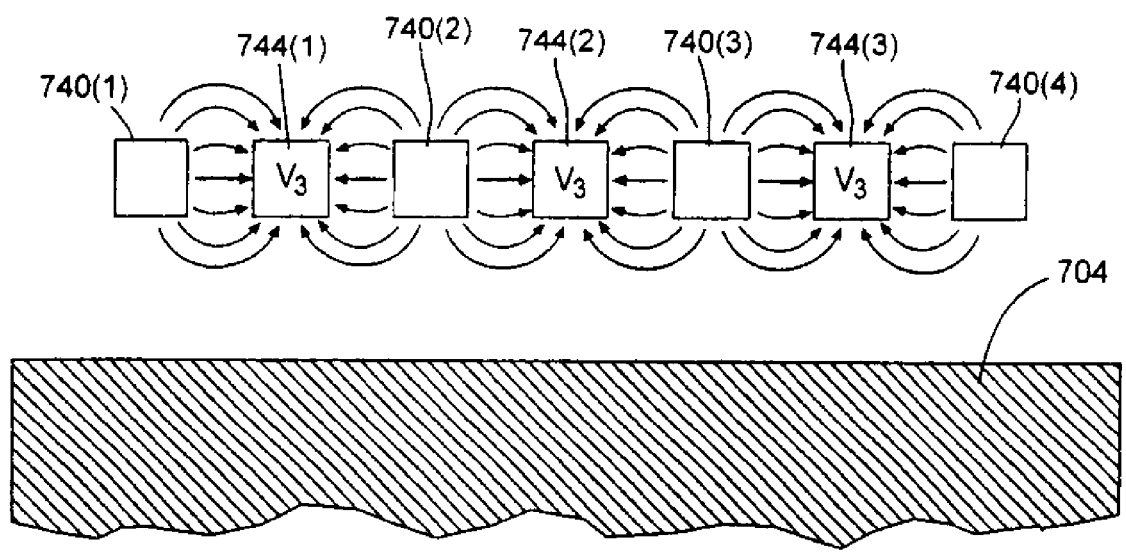
FIG. 6D is a cross-sectional drawing illustrating the electric field characteristics for an interdigitated snare-micromirror embodiment of the invention.
Figure 7A:
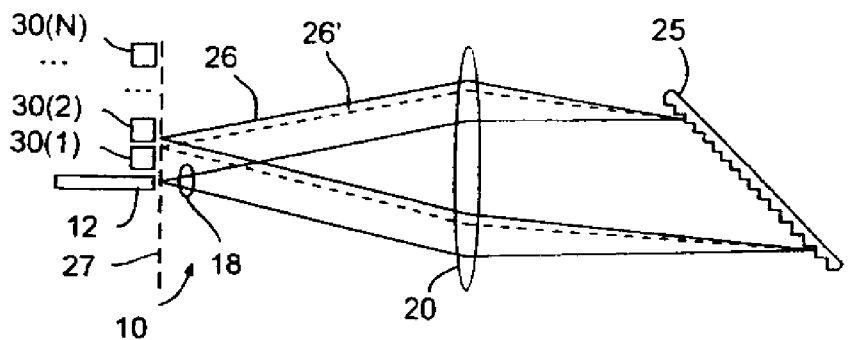
Figure 7B:
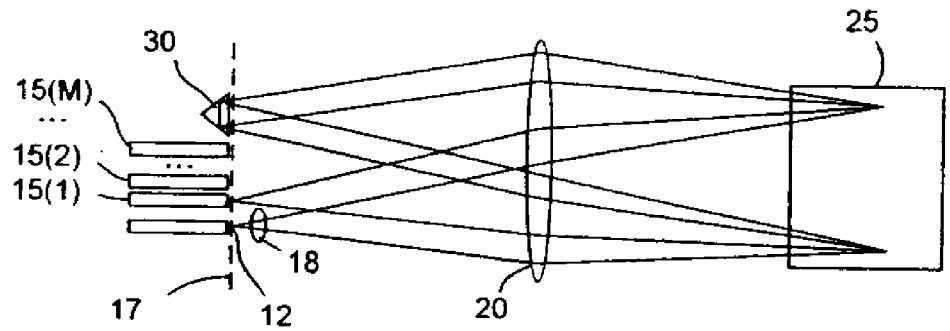
Figure 7C:
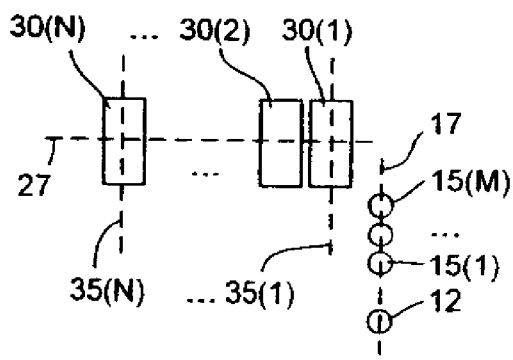
Figure 8A:
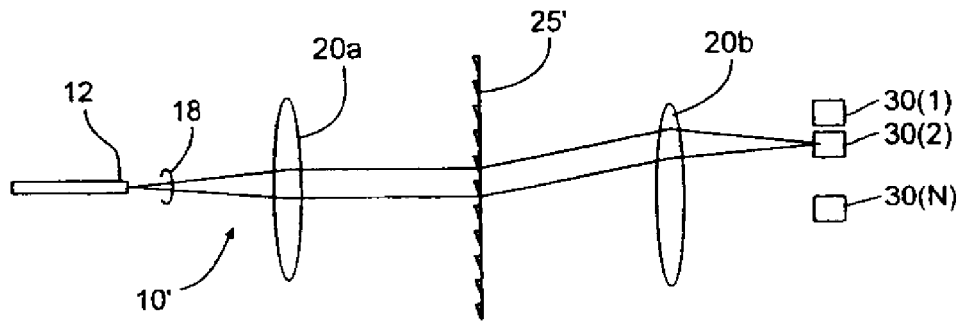
Figure 8B:
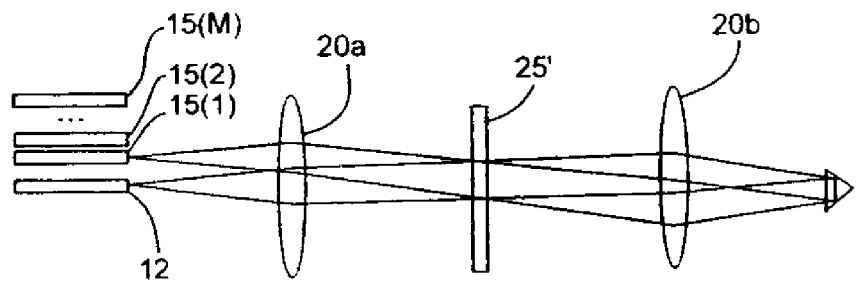
Figure 9:
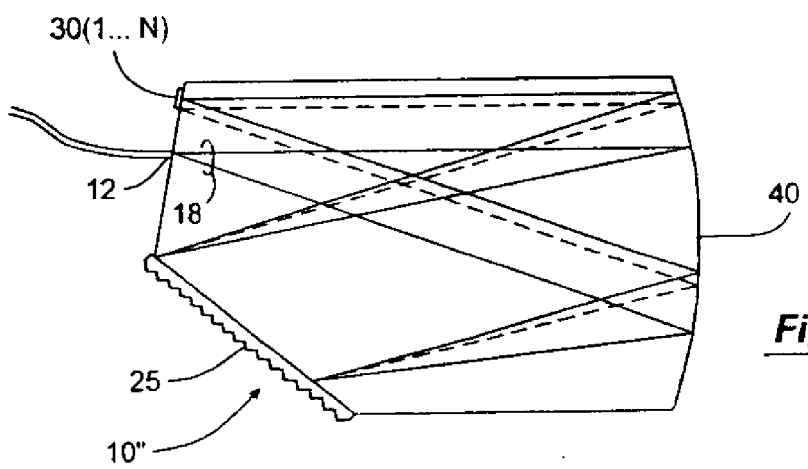
Figure 10A:
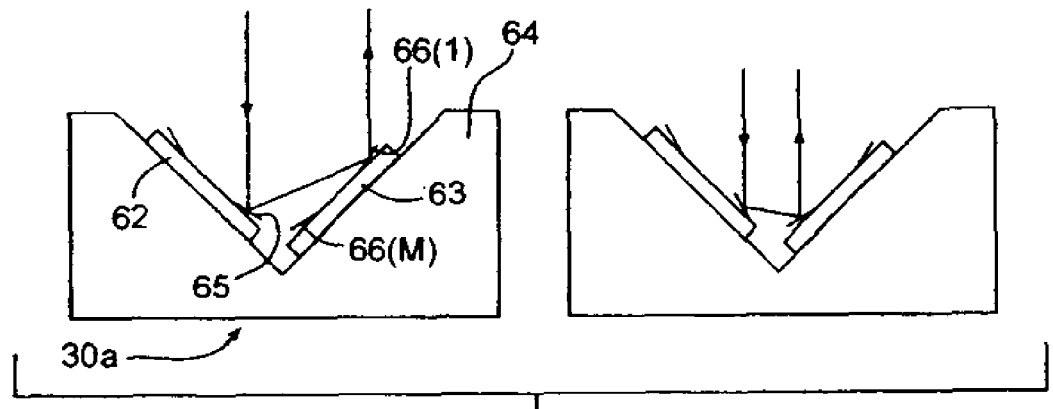
Figure 10B:
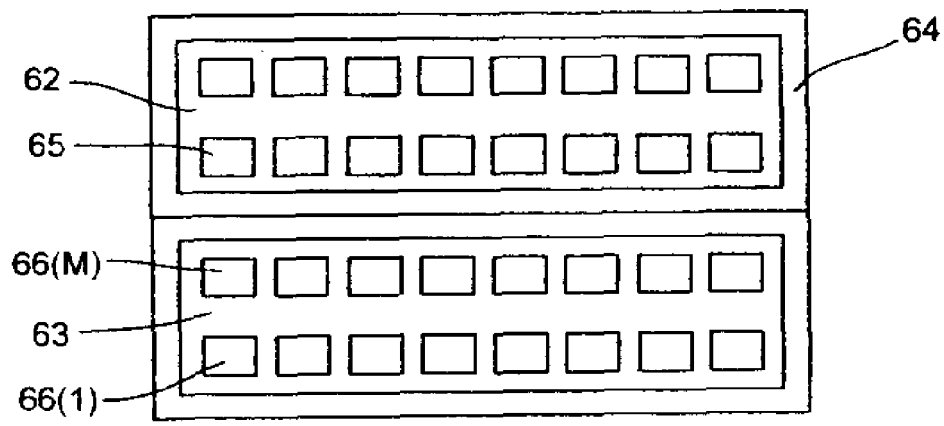

The electric field that suspends the micromirror in the tilted state is shown with electrostatic field lines in FIG. 6D. The figure generally shows cut A—A across the micromirror and snare fingers of FIG. 6C. As illustrated, the interdigitated structure produces a sequence of bodies alternately at different potentials (ground and $V_3$) above the substrate 704. For any given snare finger 744, the electrostatic fields are balanced on either side by the presence of the interdigitated micromirror fingers 740 so that the net force on the snare finger 744 vanishes. Similarly, for any given micromirror finger 740, interdigitation with the snare fingers 744 results in balancing of the electrostatic forces to produce a net zero force. Thus, this embodiment also provides a contactless tilting micromirror configuration that avoids stiction problems.

The arrangement shown in FIGS. 6A–6D is configured such that the micromirror assembly operates as a cantilever arrangement and the snare assembly operates as a torsion-beam arrangement. Alternative arrangements may be accommodated within the scope of the invention. For example, the micromirror assembly may instead be configured as a torsion-beam arrangement and the snare assembly may instead be configured as a cantilever arrangement, or various combinations thereof. Furthermore, the arrangement shown in FIGS. 6A–6D is configured such that the micromirror assembly is above the snare assembly in the unactuated horizontal position. Alternatively, the snare assembly may be configured above the micromirror assembly in the horizontal position such that the snare fingers will tilt downwards towards the upwardly tilting micromirror fingers upon electrode actuation.

5. Fiber-Optics Applications a. Wavelength Router

Tilting micromirrors according to the embodiments described above, and their equivalents, may be used in numerous applications as parts of optical switches, display devices, or signal modulators, among others. One particular application of such tilting micromirrors is as optical switches in a wavelength router such as may be used in fiber-optic telecommunications systems. One such wavelength router is described in detail in the copending, commonly assigned U.S. patent application, filed Nov. 16, 1999 and assigned Ser. No. 09/442,061, entitled "Wavelength Router," which is herein incorporated by reference in its entirety, including the Appendix, for all purposes. The various micromirror embodiments may be used in that wavelength router or may be incorporated into other wavelength routers as optical switches where it is desirable to avoid stiction problems.

Fiber optic telecommunications systems are currently deploying a relatively new technology called dense wavelength division multiplexing (DWDM) to expand the capacity of new and existing optical fiber systems to help satisfy the steadily increasing global demand for bandwidth. In DWDM, multiple wavelengths of light simultaneously transport information through a single optical fiber. Each wavelength operates as an individual channel carrying a stream of data. The carrying capacity of a fiber is multiplied by the number of DWDM channels used. Today DWDM systems employing up to 80 channels are available from multiple manufacturers, with more promised in the future.

In all telecommunication networks, there is the need to connect individual channels (or circuits) to individual destination points, such as an end customer or to another network. Systems that perform these functions are called cross-connects. Additionally, there is the need to add or drop particular channels at an intermediate point. Systems that perform these functions are called add-drop multiplexers (ADMs). All of these networking functions are performed with a wavelength router used with the current invention by an all-optical network. Optical networks designed to operate at the wavelength level are commonly called "wavelength routing networks" or "optical transport networks" (OTN). In a wavelength routing network, the individual wavelengths in a DWDM fiber must be manageable. New types of photonic network elements operating at the wavelength level are required to perform the cross-connect, ADM and other network switching functions. Two of the primary functions are optical add-drop multiplexers (OADM) and wavelength-selective cross-connects (WSXC).

Wavelength routing functions may be performed optically with a free-space optical train disposed between the input ports and the output ports, and a routing mechanism. The free-space optical train can include air-spaced elements or can be of generally monolithic construction. The optical train includes a dispersive element such as a diffraction grating, and is configured so that the light from the input port encounters the dispersive element twice before reaching any of the output ports. The routing mechanism includes one or more routing elements and cooperates with the other elements in the optical train to provide optical paths that couple desired subsets of the spectral bands to desired output ports. The routing elements are disposed to intercept the different spectral bands after they have been spatially separated by their first encounter with the dispersive element.

Figure 7A:
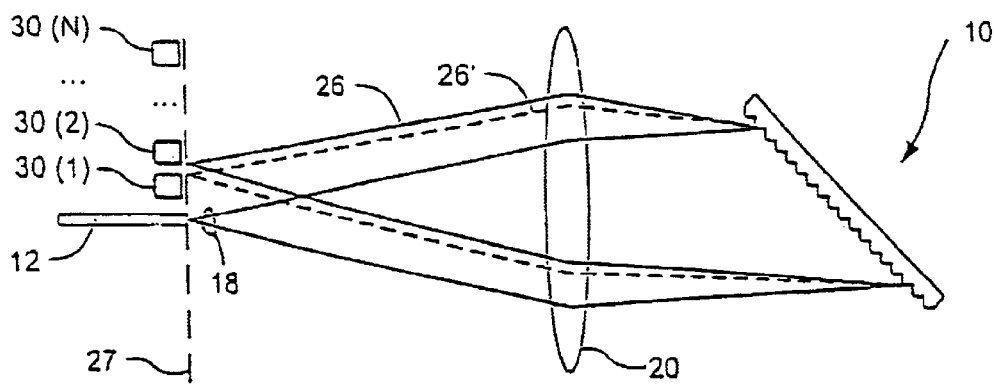
FIGS. 7A, 7B, and 7C are schematic top, side, and end views, respectively, of one embodiment of a wavelength router that uses spherical focusing elements.
Figure 7B:
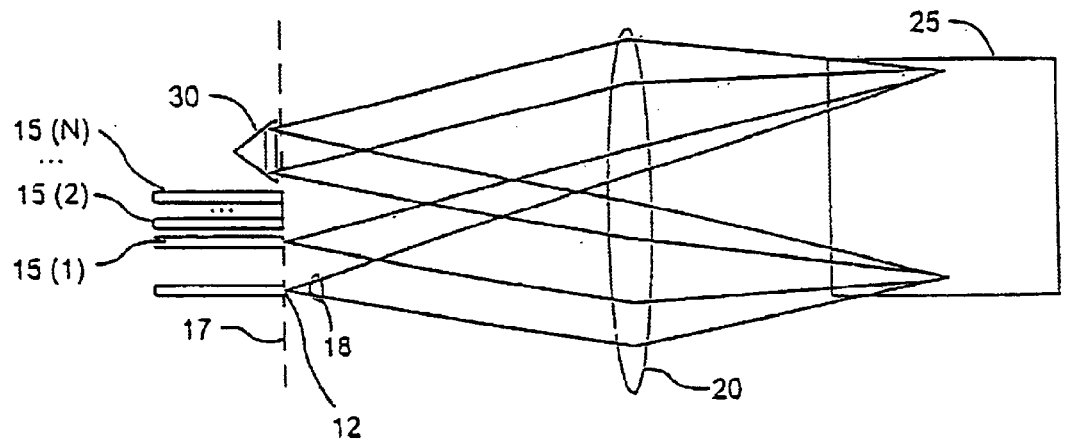
Figure 7C:
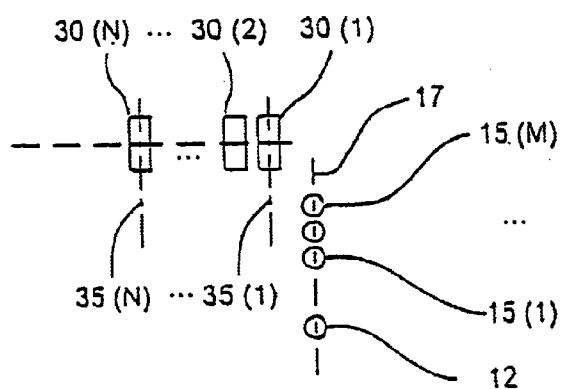

FIGS. 7A, 7B, and 7C are schematic top, side, and end views, respectively, of one embodiment of a wavelength router 10. Its general functionality is to accept light having a plurality N of spectral bands at an input port 12, and to direct subsets of the spectral bands to desired ones of a plurality M of output ports, designated 15(1) . . . 15(M). The output ports are shown in the end view of FIG. 7C as disposed along a line 17 that extends generally perpendicular to the top view of FIG. 7A. Light entering the wavelength router 10 from input port 12 forms a diverging beam 18, which includes the different spectral bands. Beam 18 encounters a lens 20 that collimates the light and directs it to a reflective diffraction grating 25. The grating 25 disperses the light so that collimated beams at different wavelengths are directed at different angles back towards the lens 20.

Two such beams are shown explicitly and denoted 26 and 26', the latter drawn in dashed lines. Since these collimated beams encounter the lens 20 at different angles, they are focused towards different points along a line 27 in a transverse plane extending in the plane of the top view of FIG. 7A. The focused beams encounter respective ones of a plurality of retroreflectors that may be configured according as contactless micromirror optical switches as described above, designated 30(1) . . . 30(N), located near the transverse plane. The beams are directed back, as diverging beams, to the lens 20 where they are collimated, and directed again to the grating 25. On the second encounter with the grating 25, the angular separation between the different beams is removed and they are directed back to the lens 20, which focuses them. The retroreflectors 30 may be configured to send their intercepted beams along a reverse path displaced along respective lines 35(1) . . . 35(N) that extend generally parallel to line 17 in the plane of the side view of FIG. 7B and the end view of FIG. 2C, thereby directing each beam to one or another of output ports 15.

Figure 8A:
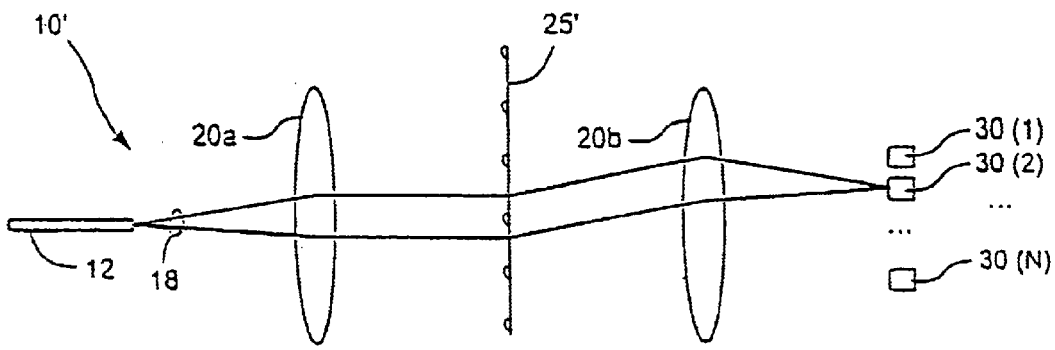
FIGS. 8A and 8B are schematic top and side views, respectively, of a second embodiment of a wavelength router that uses spherical focusing elements.
Figure 8B:
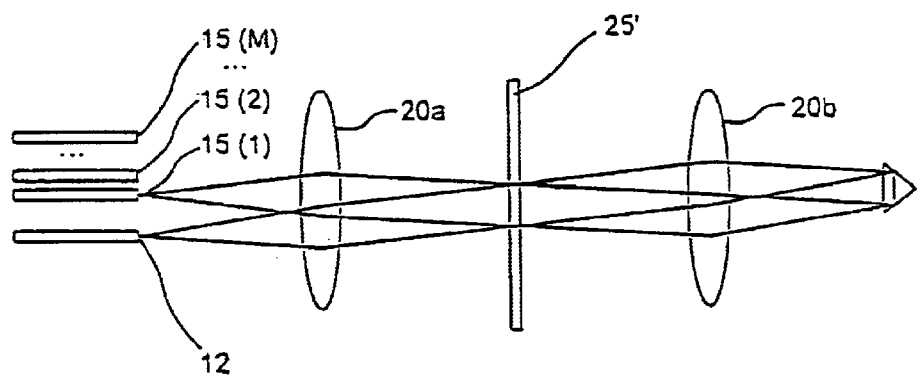

Another embodiment of a wavelength router, designated 10', is illustrated with schematic top and side views in FIGS. 8A and 8B, respectively. This embodiment may be considered an unfolded version of the embodiment of FIGS. 7A–7C. Light entering the wavelength router 10' from input port 12 forms diverging beam 18, which includes the different spectral bands. Beam 18 encounters a first lens 20a, which collimates the light and directs it to a transmissive grating 25'. The grating 25' disperses the light so that collimated beams at different wavelengths encounter a second lens 20b, which focuses the beams. The focused beams are reflected by respective ones of plurality of retroreflectors 30, which may also be configured as contactless micromirror optical switches, as diverging beams, back to lens 20b, which collimates them and directs them to grating 25'. On the second encounter, the grating 25' removes the angular separation between the different beams, which are then focused in the plane of output ports 15 by lens 20a.

Figure 9:
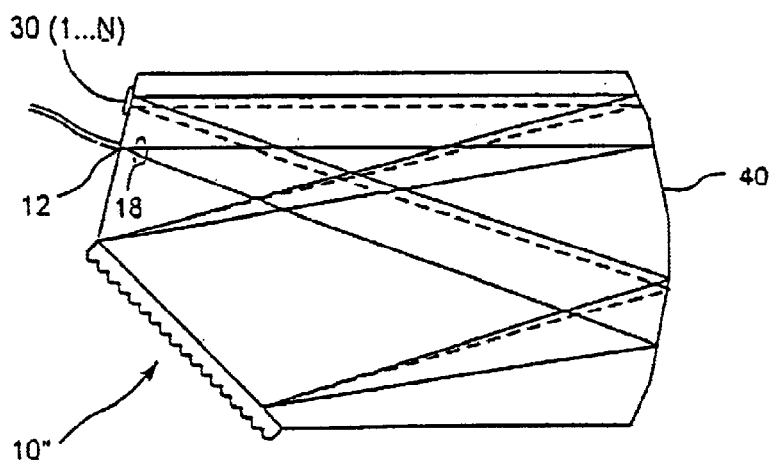
FIG. 9 is a schematic top view of a third embodiment of a wavelength router that uses spherical focusing elements.

A third embodiment of a wavelength router, designated 10", is illustrated with the schematic top view shown in FIG. 9. This embodiment is a further folded version of the embodiment of FIGS. 7A–7C, shown as a solid glass embodiment that uses a concave reflector 40 in place of lens 20 of FIGS. 7A–7C or lenses 20a and 20b of FIGS. 8A–8B. Light entering the wavelength router 10" from input port 12 forms diverging beam 18, which includes the different spectral bands. Beam 18 encounters concave reflector 40, which collimates the light and directs it to reflective diffraction grating 25, where it is dispersed so that collimated beams at different wavelengths are directed at different angles back towards concave reflector 40. Two such beams are shown explicitly, one in solid lines and one in dashed lines. The beams then encounter retroreflectors 30 and proceed on a return path, encountering concave reflector 40, reflective grating 25', and concave reflector 40, the final encounter with which focuses the beams to the desired output ports. Again, the retroreflectors 30 may be configured as contactless micromirror optical switches.

b. Contactless-Micromirror Optical-Switch Retroreflector Implementations

Figure 10A:
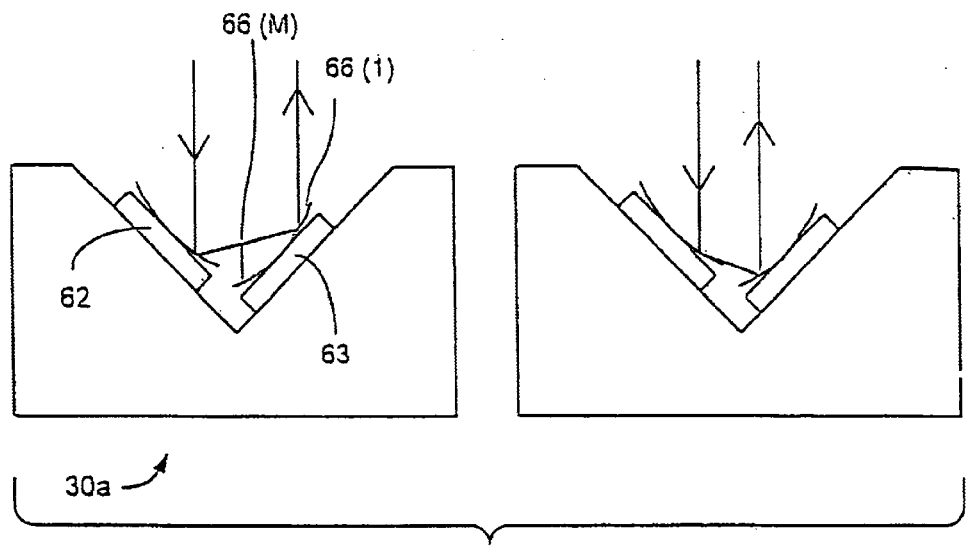
FIGS. 10A and 10B are side and top views of an implementation of a micromirror retroreflector array.
Figure 10B:
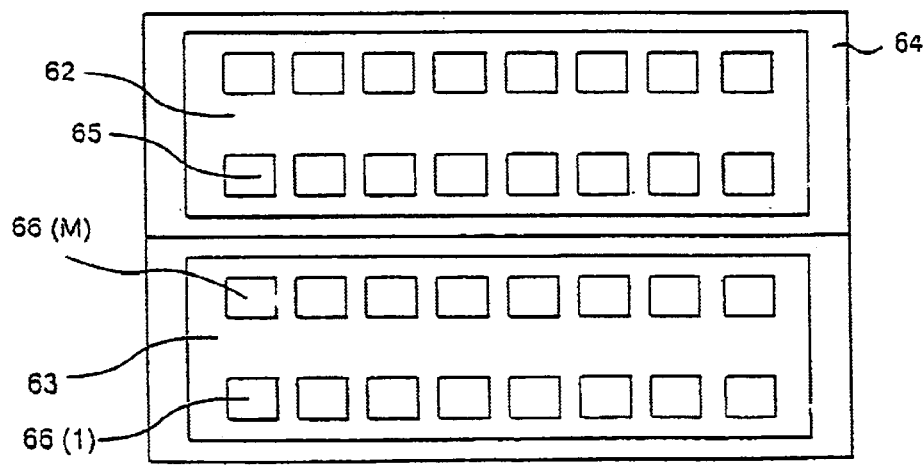
Figure 1A:
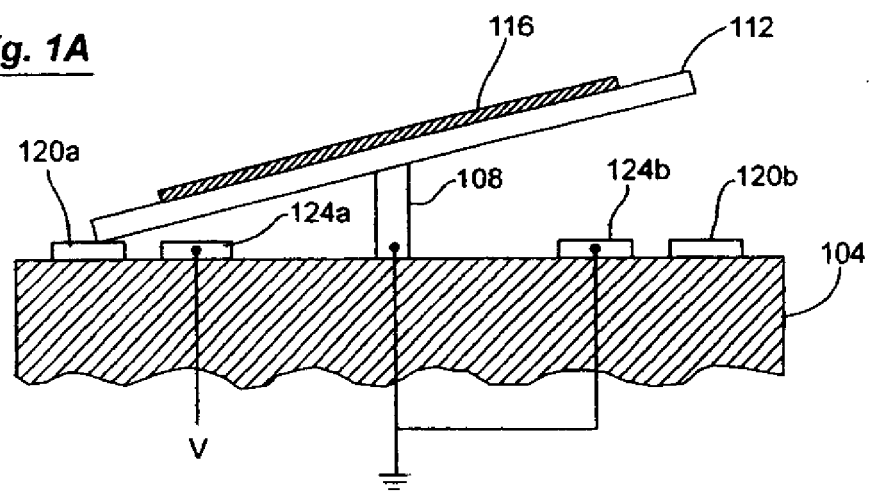
Figure 1B:
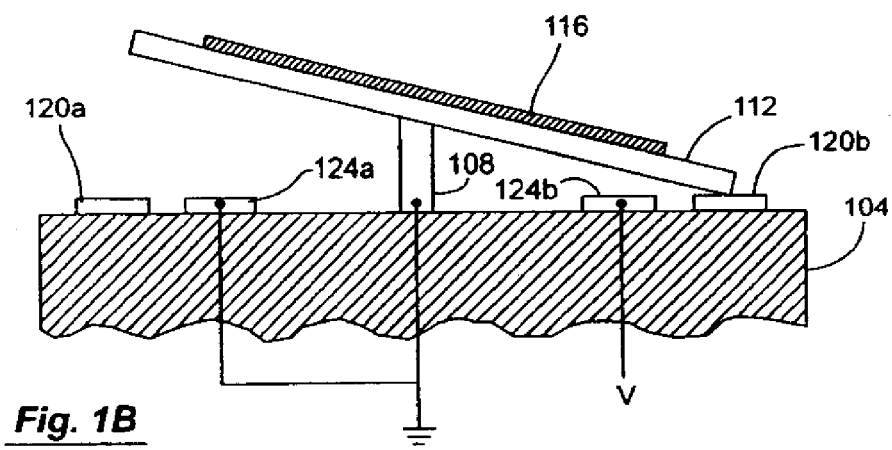
Figure 1C:
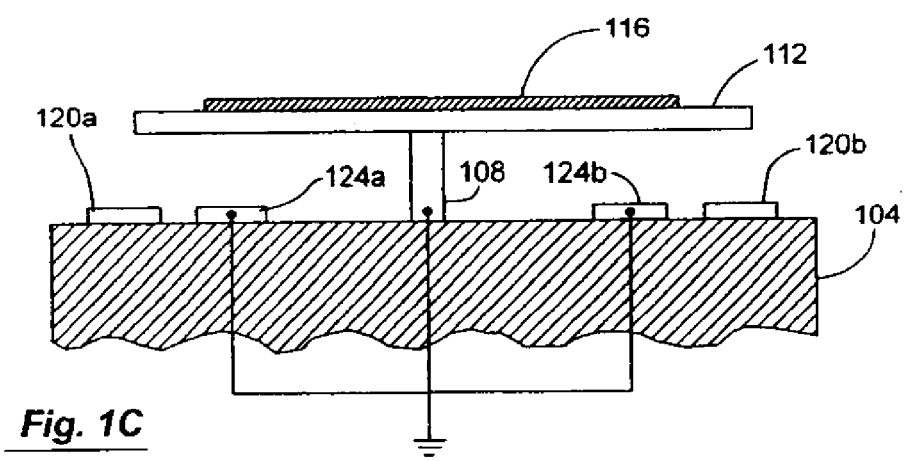

FIG. 10A shows schematically the operation of a retroreflector, designated 30a, that uses contactless-micromirror optical switches. FIG. 10B is a top view. A pair of micromirror arrays 62 and 63 is mounted to the sloped faces of a V-block 64. A single micromirror 65 in micromirror array 62 and a row of micromirrors 66(1 . . . M) in micromirror array 63 define a single retroreflector. Micromirror arrays may conveniently be referred to as the input and output micromirror arrays, with the understanding that light paths are reversible. The left portion of the figure shows micromirror 65 in a first orientation so as to direct the incoming beam to micromirror 66(1), which is oriented 90° with respect to micromirror 65's first orientation to direct the beam back in a direction opposite to the incident direction. The right half of the figure shows micromirror 65 in a second orientation so as to direct the incident beam to micromirror 66(M). Thus, micromirror 65 is moved to select the output position of the beam, while micromirrors 66(1 . . . M) are fixed during normal operation. Micromirror 65 and the row of micromirrors 66(1 . . . M) can be replicated and displaced in a direction perpendicular to the plane of the figure. While micromirror array 62 need only be one-dimensional, it may be convenient to provide additional micromirrors to provide additional flexibility.

In one embodiment, the micromirror arrays are planar and the V-groove has a dihedral angle of approximately 90° so that the two micromirror arrays face each other at 90°. This angle may be varied for a variety of purposes by a considerable amount, but an angle of 90° facilitates routing the incident beam with relatively small angular displacements of the micromirrors. In certain embodiments, the input micromirror array has at least as many rows of micromirrors as there are input ports (if there are more than one), and as many columns of mirrors as there are wavelengths that are to be selectably directed toward the output micromirror array. Similarly, in some embodiments, the output micromirror array has at least as many rows of micromirrors as there are output ports, and as many columns of mirrors as there are wavelengths that are to be selectably directed to the output ports.

In a system with a magnification factor of one-to-one, the rows of micromirrors in the input array are parallel to each other and the component of the spacing from each other along an axis transverse to the incident beam corresponds to the spacing of the input ports. Similarly, the rows of micromirrors in the output array are parallel to each other and spaced from each other (transversely) by a spacing corresponding to that between the output ports. In a system with a different magnification, the spacing between the rows of mirrors would be adjusted accordingly.

Having described several embodiments, it will be recognized by those of skill in the art that various modifications, alternative constructions, and equivalents may be used without departing from the spirit of the invention. Accordingly, the above description should not be taken as limiting the scope of the invention, which is defined in the following claims.

What is claimed is:

1. A microstructure for steering light, the microstructure comprising:
    a substrate;
    a first tiltable assembly connected with the substrate, the first tiltable assembly including a reflective coating;
    a second tiltable assembly connected with the substrate; and
    first and second electrodes connected with the substrate and respectively configured to tilt the first and second tiltable assemblies upon activation such that the first and second tiltable assemblies are interdigitated.

2. The microstructure recited in claim 1 wherein the first tiltable assembly is configured as a cantilever arrangement.

3. The microstructure recited in claim 2 wherein the second tiltable assembly is configured as a torsion-beam arrangement.

4. The microstructure recited in claim 1 wherein the second tiltable assembly is configured as a torsion-beam arrangement.

5. The microstructure recited in claim 1 wherein the reflective coating comprises gold.

6. The microstructure recited in claim 1,
    wherein the first tiltable assembly includes:
        a first structural linkage connected with the substrate;
        a first structural film supported by the first structural linkage and having a plurality of fingers at an end of the first structural film, with the reflective coating on the first structural film; and
    wherein the second tiltable assembly includes:
        a second structural linkage connected with the substrate; and
        a second structural film supported by the second structural linkage and having a plurality of fingers at an end of the second structural film.

7. The microstructure recited in claim 6 wherein the first and second electrodes comprise polysilicon.

8. The microstructure recited in claim 6 wherein the first and second structural films comprise polysilicon.

9. The microstructure recited in claim 6 wherein the first structural linkage has a greater height above the substrate than the second structural linkage.

10. A method for fabricating a microstructure for steering light, the method comprising:
    forming a first tiltable assembly on a substrate, the first tiltable assembly including a reflective coating;
    forming a second tiltable assembly on the substrate; and
    forming first and second electrodes on the substrate, such first and second electrodes being configured to tilt the first and second tiltable assemblies upon activation such that the first and second tiltable assemblies interdigitate.

11. The method recited in claim 10 wherein forming the first tiltable assembly comprises creating a cantilever arrangement.

12. The method recited in claim 11 wherein forming the second tiltable assembly comprises creating a torsion-beam arrangement.

13. The method recited in claim 10 wherein forming the second tiltable assembly comprises creating a torsion-beam arrangement.

14. The method recited in claim 10 wherein the reflective coating comprises gold.

15. The method recited in claim 10,
    wherein forming the first tiltable assembly includes:
        forming a first structural linkage on the substrate;
        forming a first structural film on the first structural linkage, the first structural film having a plurality of fingers at an end of the first structural film, with the reflective coating deposited on the first structural film; and
    wherein forming the second tiltable assembly includes:
        forming a second structural linkage on the substrate; and
        forming a second structural film on the second structural linkage, the second structural film having a plurality of fingers at an end of the second structural film.

16. The method recited in claim 15 wherein forming the first structural linkage comprises forming the first structural linkage on the substrate at a height greater than the second structural linkage.

17. A method for operating an optical switch, the method comprising:
    tilting a first assembly by applying a first electrostatic force, the first assembly including:
        a first structural linkage connected with a substrate;
        a first structural film supported by the first structural linkage and having a plurality of fingers at an end of the first structural film; and
        a reflective coating on the first structural film;
    tilting a second assembly by applying a second electrostatic force, the second assembly including:
        a second structural linkage connected with the substrate; and
        a second structural film supported by the second structural linkage and having a plurality of fingers at an end of the second structural film; and holding the first and second assemblies electrostatically in a fixed position with the fingers of the first and second structural films interdigitated.

18. The method recited in claim 17 wherein the first assembly is configured as a cantilever arrangement.

19. The method recited in claim 18 wherein the second assembly is configured as a torsion-beam arrangement.

20. The method recited in claim 17 wherein the second assembly is configured as a torsion-beam arrangement.

21. The method recited in claim 17 wherein the reflective coating comprises gold.

22. The method recited in claim 17 wherein tilting the first assembly comprises tilting the end of the first structural film having a plurality of fingers towards the substrate and tilting the second assembly comprises tilting the end of the second structural film having a plurality of fingers away from the structural assembly.

23. A microstructure for steering light, the microstructure comprising:

support means;

tiltable micromirror means connected with the support means;

tiltable snare means connected with the support means; and means for generating electrostatic forces for tilting the tiltable micromirror means and the tiltable snare means into an interdigitated configuration.

24. The microstructure recited in claim 23 wherein the tiltable micromirror means comprises cantilever means.

25. The microstructure recited in claim 23 wherein the snare means comprises torsion-beam means.

26. The microstructure recited in claim 23 wherein the micromirror means comprises torsion-beam means.

27. A wavelength router for receiving, at an input port, light having a plurality of spectral bands and directing subsets of the spectral bands to respective ones of a plurality of output ports, the wavelength router comprising:

a free-space optical train disposed between the input port and the output ports providing optical paths for routing the spectral bands, the optical train including a dispersive element disposed to intercept light traveling from the input port; and a routing mechanism having at least one dynamically configurable routing element to direct a given spectral band to different output ports depending on a state of the dynamically configurable routing element, wherein the dynamically configurable routing element includes:

a tiltable micromirror assembly having a micromirror structural film with a plurality of fingers at an end of the micromirror structural film;

a tiltable snare assembly having a snare structural film with a plurality of fingers at an end of the snare structural film; and a plurality of electrodes configured to tilt the micromirror assembly and snare assembly upon activation such that the fingers of the micromirror structural film and snare structural film interdigitate.

28. The wavelength router recited in claim 27 wherein the micromirror assembly is configured as a cantilever arrangement.

29. The wavelength router recited in claim 28 wherein the snare assembly is configured as a torsion-beam arrangement.

* * * * *

UNITED STATES PATENT AND TRADEMARK OFFICE
CERTIFICATE OF CORRECTION

PATENT NO. : 6,701,037 B2
DATED : March 2, 2004
INVENTOR(S) : Bevan Staple et al.

It is certified that error appears in the above-identified patent and that said Letters Patent is hereby corrected as shown below:

Please replace the drawings with the following set of formal drawings:

Signed and Sealed this

Fourteenth Day of September, 2004

JON W. DUDAS
*Director of the United States Patent and Trademark Office*